US00RE46769E

(19) United States
(12) Reissued Patent
Kikuchi

(10) Patent Number: US RE46,769 E
(45) Date of Reissued Patent: *Mar. 27, 2018

(54) SOLID-STATE IMAGING DEVICE AND ELECTRONIC APPARATUS HAVING A LIGHT BLOCKING PART

(71) Applicant: Sony Corporation, Tokyo (JP)

(72) Inventor: Koji Kikuchi, Kanagawa (JP)

(73) Assignee: Sony Corporation, Tokyo (JP)

( * ) Notice: This patent is subject to a terminal disclaimer.

(21) Appl. No.: 14/805,750

(22) Filed: Jul. 22, 2015

Related U.S. Patent Documents

Reissue of:
(64) Patent No.: 8,493,452
Issued: Jul. 23, 2013
Appl. No.: 13/529,502
Filed: Jun. 21, 2012

U.S. Applications:
(62) Division of application No. 12/705,152, filed on Feb. 12, 2010, now Pat. No. 8,243,146.

(30) Foreign Application Priority Data

Feb. 23, 2009 (JP) ..... 2009-038943

(51) Int. Cl.
*H04N 5/228* (2006.01)
*H04N 5/335* (2011.01)
(Continued)

(52) U.S. Cl.
CPC ..... *H04N 5/3696* (2013.01); *G02B 3/0068* (2013.01); *G02B 5/201* (2013.01);
(Continued)

(58) Field of Classification Search
CPC ..... G02B 3/0068; G02B 5/201; G02B 5/223; H01L 27/1462; H01L 27/1463;
(Continued)

(56) References Cited

U.S. PATENT DOCUMENTS 6,829,008 B1 * 12/2004 Kondo ..... G02B 7/34 348/302
2002/0025164 A1 2/2002 Suzuki
(Continued)

FOREIGN PATENT DOCUMENTS

EP 1 912 434 A1 4/2008
JP 62-042449 2/1987
(Continued)

OTHER PUBLICATIONS

Official Action (with English translation) for Korean Patent Application No. 10-2016-0110557 dated Sep. 19, 2016, 7 pages.
(Continued)

*Primary Examiner* — Yuzhen Ge
(74) *Attorney, Agent, or Firm* — Sheridan Ross P.C.

(57) ABSTRACT

A solid-state imaging device including a plurality of pixel units configured and disposed in an imaging area in such a way that a plurality of pixels corresponding to different colors are treated as one unit, the amount of shift of a position of each of the pixels in the pixel unit being set as to differ depending on distance from a center of the imaging area to the pixel unit and a color.

17 Claims, 17 Drawing Sheets

(51) Int. Cl.

| | |
|---|---|
| ***H04N 5/369*** | (2011.01) |
| ***H01L 27/146*** | (2006.01) |
| ***H04N 9/04*** | (2006.01) |
| ***H04N 5/357*** | (2011.01) |
| ***G02B 5/22*** | (2006.01) |
| ***G02B 5/20*** | (2006.01) |
| ***G02B 3/00*** | (2006.01) |

(52) U.S. Cl.
CPC ..... *G02B 5/223* (2013.01); *H01L 27/1463* (2013.01); *H01L 27/1464* (2013.01); *H01L 27/14629* (2013.01); *H04N 5/3572* (2013.01); *H04N 9/045* (2013.01)

(58) Field of Classification Search
CPC ..... H01L 27/1464; H04N 5/3572; H04N 5/3696; H04N 9/045
See application file for complete search history.

(56) References Cited

U.S. PATENT DOCUMENTS

2004/0141087 A1 7/2004 Oda et al.
2004/0145665 A1 7/2004 Oda et al.
2004/0159774 A1 8/2004 Mishina et al.
2004/0196563 A1* 10/2004 Natori ..... G02B 3/0018 359/626
2004/0239784 A1 12/2004 Ibe
2005/0062863 A1* 3/2005 Takeuchi ..... H01L 27/14621 348/272
2005/0133879 A1* 6/2005 Yamaguti ..... H01L 27/14621 257/435
2005/0190453 A1 9/2005 Dobashi
2005/0225654 A1 10/2005 Feldman et al.
2005/0230597 A1 10/2005 Hsieh et al.
2005/0253943 A1 11/2005 Takahashi et al.
2006/0006488 A1* 1/2006 Kanbe ..... H01L 27/14632 257/443
2007/0087275 A1* 4/2007 Jang ..... G02B 5/223 430/20
2007/0210398 A1 9/2007 Ohtsuki et al.
2008/0211939 A1* 9/2008 Brady ..... H01L 27/14618 348/250
2008/0257998 A1 10/2008 Blum et al.
2009/0027541 A1 1/2009 Takayama et al.
2010/0097491 A1 4/2010 Farina et al.
2010/0253819 A1* 10/2010 Yokozawa ..... H01L 27/14621 348/273

FOREIGN PATENT DOCUMENTS

| | | |
|---|---|---|
| JP | 63-042449 | 2/1988 |
| JP | 2000-036587 | 2/2000 |
| JP | 2001-160973 | 6/2001 |
| JP | 2006-269923 | 10/2006 |
| JP | 2007-288107 | 11/2007 |
| JP | 2008-078258 | 4/2008 |
| JP | 2009-164385 | 7/2009 |
| KR | 10-2008-0031796 | 4/2008 |
| WO | 01/28224 A2 | 4/2001 |

OTHER PUBLICATIONS

Official Action (with English translation) for Korean Patent Application No. 10-2010-0007333 dated Jan. 14, 2016, 7 pages.
Japanese Office Action dated Nov. 27, 2012 for Japanese Application No. 2009-038943.

* cited by examiner

SOLID-STATE IMAGING DEVICE AND ELECTRONIC APPARATUS HAVING A LIGHT BLOCKING PART

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

RELATED APPLICATION DATA

This application is a *Reissue of U.S. patent application Ser. No. 13/529,502, filed Jun. 21, 2012, now U.S. Pat. No. 8,493,452, which is a* division of U.S. patent application Ser. No. 12/705,152, filed on Feb. 12, 2010, *now U.S. Pat. No. 8,243,146,* the entirety of which is incorporated herein by reference to the extent permitted by law. The present invention claims priority to and contains subject matter related to Japanese Patent Application JP 2009-038943 filed in the Japan Patent Office on Feb. 23, 2009, the entire contents of which being incorporated herein by reference. *U.S. patent application Ser. No. 14/806,130, filed Jul. 22, 2015, is a continuation reissue application of this application.*

BACKGROUND OF THE INVENTION

1. Field of the Invention

The present invention relates to solid-state imaging devices and electronic apparatus. Specifically, the present invention relates to a solid-state imaging device and electronic apparatus in which plural pixels corresponding to different colors are included in one pixel unit and the pixel units are disposed in a matrix in the imaging area.

2. Description of the Related Art

Semiconductor image sensors typified by complementary metal oxide semiconductor (CMOS) image sensors are desired to include more pixels, i.e. achieve reduction in the pixel size and increase in the number of pixels in the same image area. Japanese Patent Laid-open No. 2001-160973 discloses a solid-state imaging device having a microlens, a color filter, and an aperture of a light blocking film that are disposed with the amount of shift calculated based on the output angle defined with the image height and the exit pupil distance and the film thickness from the microlens to a light receiving part. Japanese Patent Laid-open No. 2008-78258 discloses a solid-state imaging device in which the sensitivity setting is changed on a color-by-color basis. Japanese Patent Laid-open No. Sho 62-42449 discloses a solid-state imaging device in which the aperture area of a light blocking film is made different depending on the color. Japanese Patent Laid-open No. 2007-288107 discloses a solid-state imaging device in which a color filter is so disposed as to be shifted to thereby prevent the occurrence of color shading.

SUMMARY OF THE INVENTION

However, the amount of signal becomes smaller along with the increase in the number of pixels, and it is becoming difficult to ensure the same S/N ratio (signal/noise ratio). In particular, the disturbance of the color balance is caused attributed to that the deterioration of the amount of signal is significant when the angle of view of the lens is large and the deterioration of the amount of signal differs on a color-by-color basis.

There is a need for the present invention to suppress the disturbance of the color balance due to the angle of view of the lens.

According to a mode of the present invention, there is provided a solid-state imaging device including a plurality of pixel units configured to be disposed in an imaging area in such a way that a plurality of pixels corresponding to different colors are treated as one unit. In this solid-state imaging device, the amount of shift of the position of each of the pixels in the pixel unit is so set as to differ depending on the distance from the center of the imaging area to the pixel unit and a color.

In this mode of the present invention, because the amount of shift of the disposing, set for the pixels in the pixel unit over the area from the center of the imaging area to the periphery thereof, differs depending on the distance from the center of the imaging area to the pixel unit and the color, color shift in the pixel unit can be suppressed over the area from the center of the imaging area to the periphery thereof.

According to another mode of the present invention, there is provided a solid-state imaging device including a plurality of pixel units configured to be disposed in a matrix in an imaging area in such a way that a plurality of pixels corresponding to different colors are treated as one unit, and a light blocking part configured to be provided corresponding to the plurality of pixel units and have apertures corresponding to the pixels in the pixel unit. In this solid-state imaging device, the amount of shift of the position of the aperture of the light blocking part for each of the pixels in the pixel unit is so set as to differ depending on the distance from the center of the imaging area to the pixel unit and a color.

In this mode of the present invention, the amount of shift of the position, set for the apertures of the light blocking part for the pixels in the pixel unit over the area from the center of the imaging area to the periphery thereof, differs depending on the distance from the center of the imaging area to the pixel unit and the color, color shift in the pixel unit can be suppressed over the area from the center of the imaging area to the periphery thereof.

According to another mode of the present invention, there is provided electronic apparatus including the above-described solid-state imaging device. In this electronic apparatus, a circuit that processes a signal obtained by the pixels in the solid-state imaging device may be formed of a CMOS transistor. Furthermore, the pixels may be so configured as to capture light from a surface on the opposite side to a surface over which an interconnect layer is formed, of a substrate. In addition, a transfer part that transfers a charge captured in the pixels by sequential applying of potential with different phases may be provided.

The pixel in the modes of the present invention refers to a region that carries out photoelectric conversion, and encompasses not only a region structurally separated by element isolation but also a region separated in terms of the output electric signal. Furthermore, the pixel unit encompasses not only a unit that is a set of plural pixels and is structurally separated but also a unit that is conveniently separated at the boundary of the repetition of sets each composed of plural pixels.

According to the modes of the present invention, it becomes possible to suppress the disturbance of the color balance due to the angle of view of the lens and obtain a signal without color cross-talk over the area from the center of the imaging area to the periphery thereof.

DETAILED DESCRIPTION OF THE PREFERRED EMBODIMENTS

Modes for carrying out the present invention (hereinafter, referred to as "embodiments") will be described below. The description will be made in the following order.

1. Configuration Examples of Solid-state Imaging Device (Back-illuminated CMOS Sensor, Front-illuminated CMOS Sensor, Configuration of CMOS Image Sensor, and CCD Sensor)
2. Energy Profile (Profile in Pixel Unit and Change Dependent on Image Height)
3. First Embodiment (Setting of Positions of Pixels)
4. Second Embodiment (Setting of Light Reception Areas of Pixels)
5. Third Embodiment (Setting of Positions of Apertures of Light Blocking Part)
6. Fourth Embodiment (Setting of Sizes of Apertures of Light Blocking Part)
7. Electronic Apparatus (Example of Imaging Apparatus)

1. Configuration Examples of Solid-State Imaging Device

Configuration examples of a solid-state imaging device according to the embodiments will be described below.

[Back-Illuminated CMOS Sensor]

Figure 1:
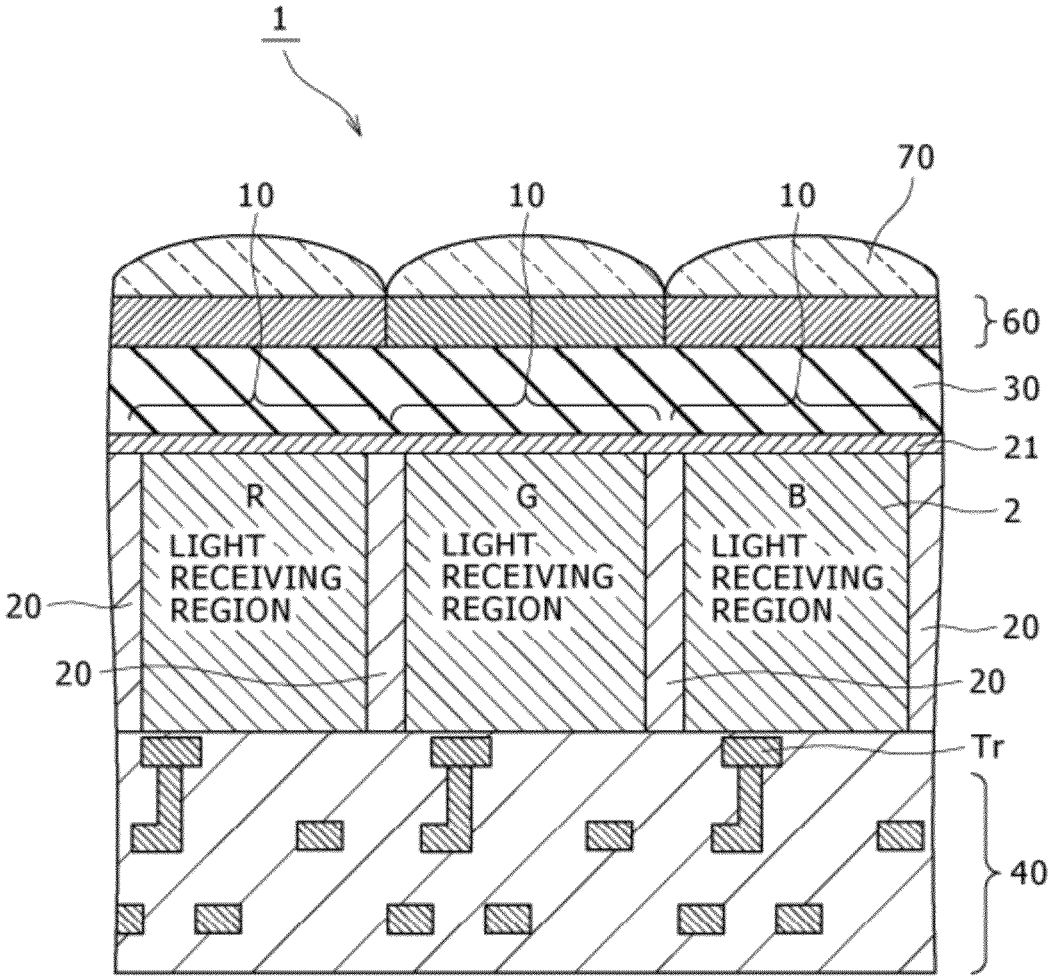
FIG. 1 is a schematic sectional view for explaining a back-illuminated CMOS sensor.

FIG. 1 is a schematic sectional view for explaining a back-illuminated CMOS sensor. In this solid-state imaging device 1, a color filter 60 is provided over one surface of a silicon substrate 2 in which light receiving regions serving as pixels 10 are provided, and an interconnect layer 40 for signals obtained by photoelectric conversion in the light receiving regions is provided over the other surface of the silicon substrate 2. Due to this feature, the solid-state imaging device 1 has a configuration in which light is incident on the light receiving regions from the surface on the opposite side to the surface over which the interconnect layer 40 is provided and the photoelectric conversion is carried out in the light receiving regions.

In the solid-state imaging device 1, the light receiving regions of the respective colors formed in the silicon substrate 2 are isolated from each other by element isolating parts 20. Over the light receiving regions, the color filter 60 is formed with the intermediary of an antireflection film 21 and an interlayer insulating film 30. The color filter 60 is based on e.g. the Bayer array in matching with the arrangement of the light receiving regions corresponding to the respective colors of red (R), green (G), and blue (B). Microlenses 70 are provided on the color filter 60 of the respective colors.

For manufacturing the so-called back-illuminated CMOS sensor, the element isolating parts 20 for isolating the light receiving regions corresponding to the respective colors from each other are formed in the vicinity of a surface (on the lower side, in FIG. 1) of the silicon substrate 2 by implantation of P-type impurity ions. Subsequently, the light receiving regions corresponding to the respective colors are formed between the element isolating parts 20 by implantation of N-type and P-type impurity ions. Furthermore, transistors Tr for pixel driving and so on and the interconnect layer 40 are formed over the light receiving regions.

Examples of the transistor Tr include various kinds of transistors such as a readout transistor for reading out the charge captured in the light receiving region, an amplification transistor for amplifying the output of a photodiode, a selection transistor for selecting the photodiode, and a reset transistor for discharging the charge.

In this state, a support substrate is attached to the interconnect layer 40 side of the silicon substrate 2 and the back surface (on the upper side, in FIG. 1) of the silicon substrate 2 is polished by chemical mechanical polishing (CMP) with the silicon substrate 2 supported by the support substrate. This polishing is performed until the light receiving regions are exposed.

Subsequently, the antireflection film 21 (e.g. HfO film with 64-nm thickness) and the interlayer insulating film 30 (e.g. $SiO_2$ film with 500-nm thickness) are formed on the back surface side of the silicon substrate 2, where the light receiving regions are exposed.

Moreover, on the interlayer insulating film 30, the color filter 60 (e.g. with 500-nm thickness) corresponding to the light receiving regions is formed, and the microlenses 70 (e.g. with a lens part thickness of 350 nm) are formed corresponding to the color filter 60.

These steps complete the solid-state imaging device 1 in which light incident from the back surface (on the upper side, in FIG. 1) of the silicon substrate 2 is condensed by the microlenses 70 and light beams of the respective colors are received by the light receiving regions via the color filter 60. In this structure, the interconnect layer 40 does not exist on the light incidence side of the light receiving regions, and therefore the aperture ratios of the respective light receiving regions can be enhanced.

Figure 2:
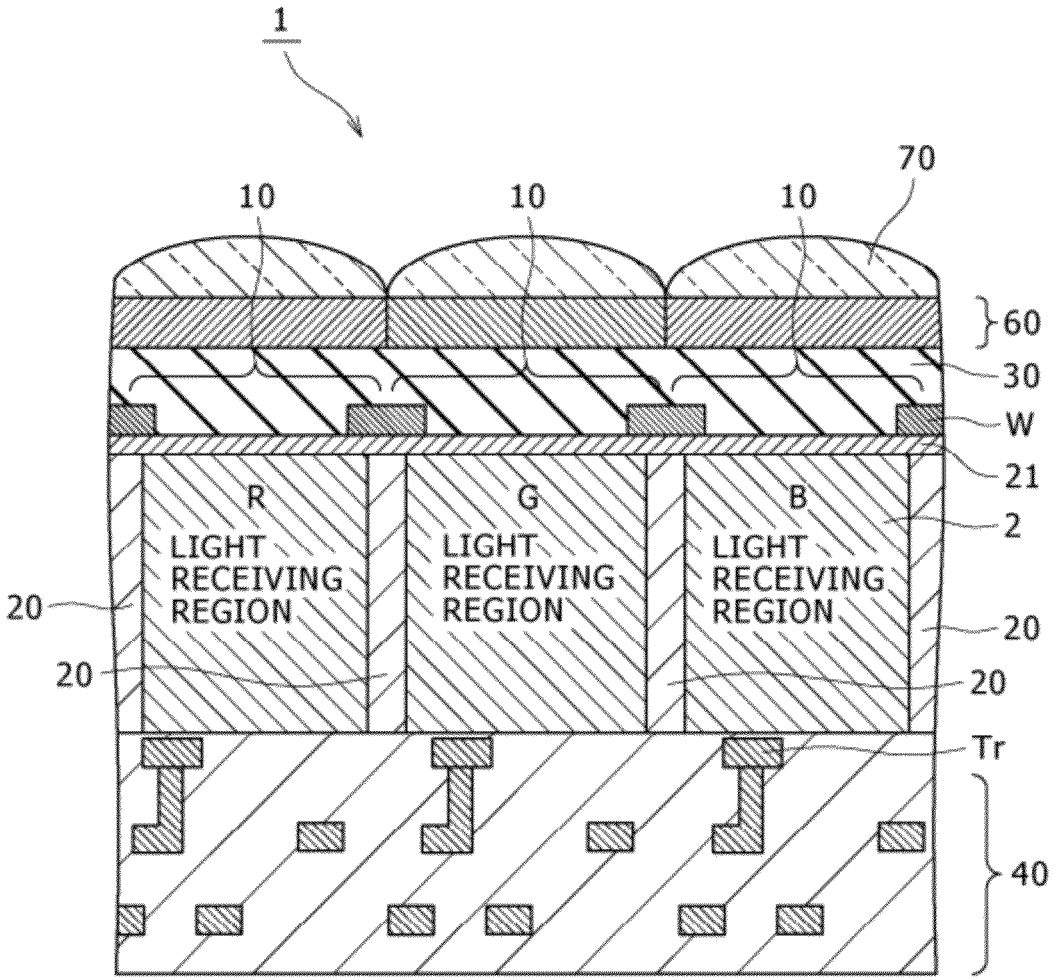
FIG. 2 is a schematic sectional view for explaining a back-illuminated CMOS sensor having a light blocking part.

FIG. 2 is a schematic sectional view for explaining a back-illuminated CMOS sensor having a light blocking part. The configuration of the back-illuminated CMOS sensor having the light blocking part is basically the same as the configuration shown in FIG. 1. Specifically, the color filter 60 is provided over one surface of the silicon substrate 2 in which the light receiving regions serving as the pixels 10 are provided, and the interconnect layer 40 for signals obtained by photoelectric conversion in the light receiving regions is provided over the other surface of the silicon substrate 2. Thus, light is incident on the light receiving regions from the surface on the opposite side to the surface over which the interconnect layer 40 is provided and the photoelectric conversion is carried out in the light receiving regions.

In the CMOS sensor with the configuration shown in FIG. 2, a light blocking part W is formed in the interlayer insulating film 30 formed on the antireflection film 21. The light blocking part W is so provided that light passing through the color filter 60 of the respective colors is prevented from entering the region other than the light receiving region of the corresponding pixel 10. The light blocking part W is composed of e.g. tungsten and has apertures corresponding to the light receiving regions of the respective colors.

[Front-Illuminated CMOS Sensor]

Figure 3:
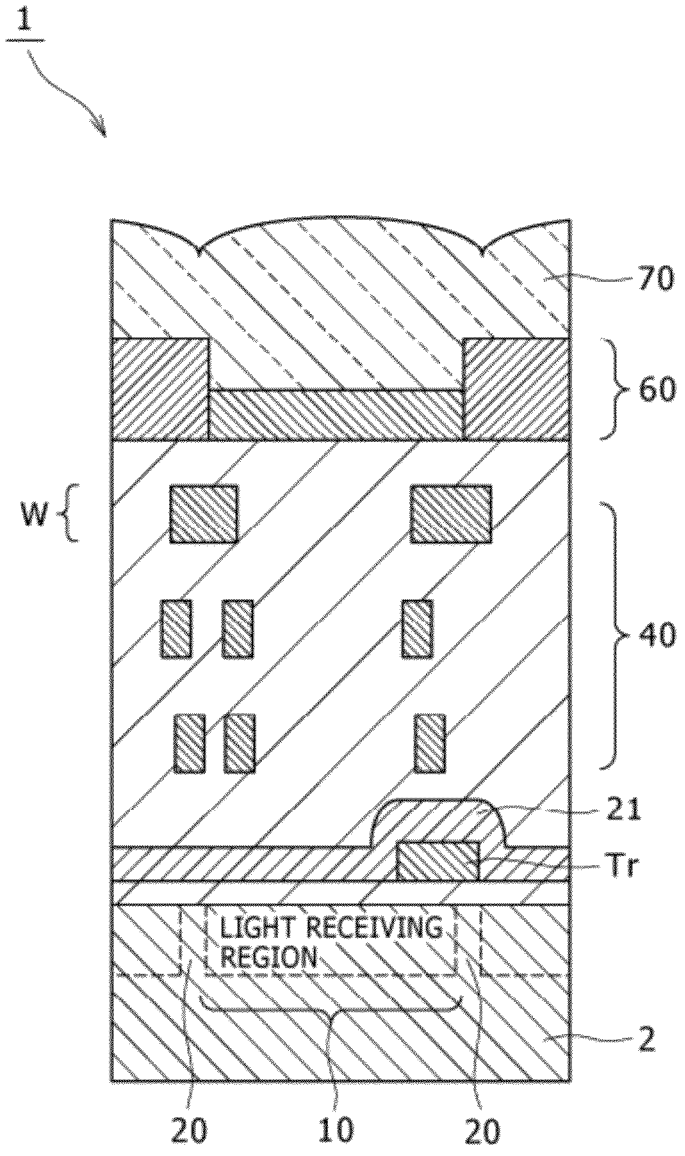
FIG. 3 is a schematic sectional view for explaining a front-illuminated CMOS sensor.

FIG. 3 is a schematic sectional view for explaining a front-illuminated CMOS sensor. In this solid-state imaging device 1, light receiving regions formed of photodiodes are formed in a silicon substrate 2, and transistors Tr are formed corresponding to the light receiving regions.

Examples of the transistor Tr include various kinds of transistors such as a readout transistor for reading out the charge captured in the light receiving region, an amplification transistor for amplifying the output of the photodiode, a selection transistor for selecting the photodiode, and a reset transistor for discharging the charge.

An antireflection film 21 is formed on the transistors Tr, and plural interconnect layers 40 are formed with the intermediary of an interlayer insulating film. An optical waveguide formed of an organic film may be buried in the interconnect layers 40 according to need.

Above the interconnect layers 40, RGB color filters 60 are formed for each predetermined area in predetermined arrangement order. Furthermore, microlenses 70 are formed corresponding to the color filters 60 of the respective colors. In the present example, the aperture for one light receiving region has a size of 2.5 μm square.

This solid-state imaging device 1 has a structure in which the interconnect layers 40 and the color filters 60 are provided over one surface of the silicon substrate 2, in which the light receiving regions of the pixel parts are provided. That is, in this configuration, the microlenses 70, the color filters 60, and the interconnect layers 40 are provided on the light incidence side of the light receiving regions. In addition, light is incident from the surface over which the interconnect layers 40 are provided, of the silicon substrate 2, and photoelectric conversion is carried out in the light receiving regions.

In this solid-state imaging device 1, ambient light is condensed by the microlenses 70 and separated into light beams each having a wavelength corresponding to a predetermined color via the respective color filters 60 of RGB. The light beams of RGB reach the light receiving regions provided in the silicon substrate 2 via the interconnect layers 40. Subsequently, photoelectric conversion is carried out in the light receiving regions, so that electric signals dependent on the amounts of light beams of RGB are acquired by driving of the transistors Tr.

In the solid-state imaging device 1 formed of the front-illuminated CMOS sensor, the interconnect of the uppermost layer among the interconnect layers 40 is used also as the light blocking part W. Specifically, by setting the position and width of this interconnect to predetermined values, light passing through the color filters 60 of the respective colors is prevented from entering the region other than the light receiving region of the corresponding pixel 10.

[Configuration of CMOS Image Sensor]

Figure 4:
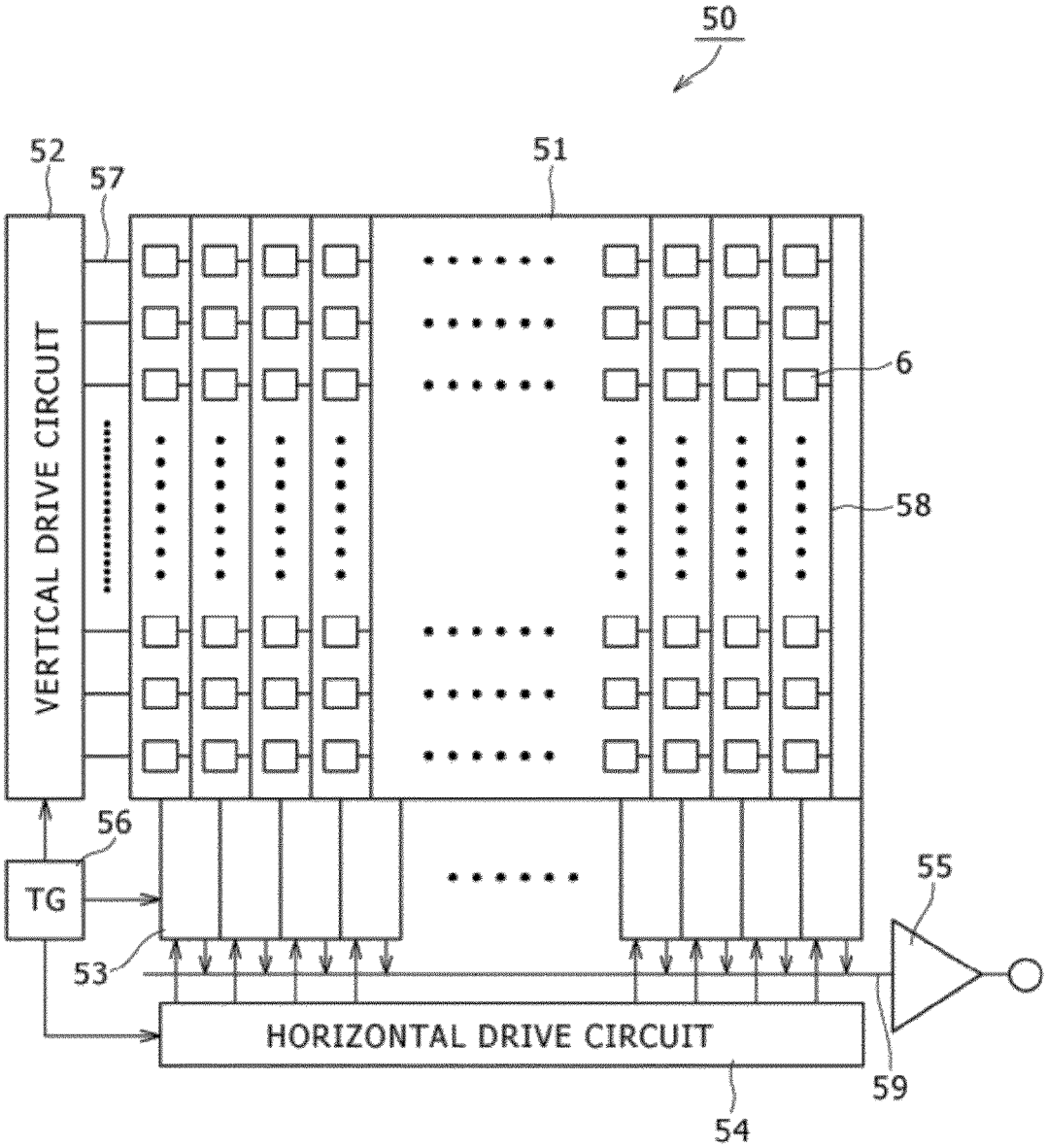
FIG. 4 is a diagram for explaining the entire configuration of a CMOS sensor.

FIG. 4 is a diagram for explaining the entire configuration of a solid-state imaging device formed of a CMOS image sensor. As shown in FIG. 4, a CMOS image sensor 50 has a pixel array unit 51 formed on a semiconductor substrate (chip) (not shown) and peripheral circuits provided on the same semiconductor substrate as that of the pixel array unit 51. As the peripheral circuits of the pixel array unit 51, a vertical drive circuit 52, column circuits 53 as signal processing circuits, a horizontal drive circuit 54, an output circuit 55, a timing generator (TG) 56, and so on are used.

In the pixel array unit 51, unit pixels (hereinafter, the unit pixel will be often referred to simply as the "pixel") 6 are two-dimensionally disposed in a matrix. The unit pixel 6 includes a photoelectric conversion element that carries out photoelectric conversion of incident visible light into the amount of charge dependent on the amount of light. The specific configuration of the unit pixel 6 will be described later.

Furthermore, in the pixel array unit 51, for the matrix arrangement of the unit pixels 6, a pixel drive line 57 is formed for each pixel row along the horizontal direction of the diagram (the arrangement direction of the pixels on the pixel row) and a vertical signal line 58 is formed for each pixel column along the vertical direction of the diagram (the arrangement direction of the pixels on the pixel column). In FIG. 4, one line is shown as each pixel drive line 57. However, the number of pixel drive lines 57 per each row is not limited to one. One end of the pixel drive line 57 is connected to the output terminal of the vertical drive circuit 52, corresponding to a respective one of the pixel rows.

The vertical drive circuit 52 is composed of shift registers, address decoders, and so on. The vertical drive circuit 52 has a readout scanning system for sequentially carrying out selective scanning of the pixels 6 from which signals are to be read out on a row-by-row basis, although the specific configuration thereof is not shown in the diagram. Furthermore, the vertical drive circuit 52 has a sweep scanning system for carrying out, for the readout row for which the readout scanning is to be carried out by the readout scanning system, sweep scanning for sweeping out (resetting) the unnecessary charge from the photoelectric conversion elements in the pixels 6 on this readout row earlier than this readout scanning by the time corresponding to the shutter speed.

So-called electronic shutter operation is carried out by the sweep (reset) of the unnecessary charge by the sweep scanning system. The electronic shutter operation refers to operation of discarding the photo-charge in the photoelectric conversion element and newly starting exposure (starting accumulation of the photo-charge).

The signal read out by the readout operation by the readout scanning system corresponds to the amount of light incident after the previous readout operation or the electronic shutter operation. Furthermore, the period from the readout timing by the previous readout operation or the sweep timing by the electronic shutter operation to the readout timing by the present readout operation is equivalent to the time of photocharge accumulation in the unit pixels 6 (exposure time).

The signals output from the respective unit pixels 6 on the pixel row selected by scanning by the vertical drive circuit 52 are supplied to the column circuits 53 via the respective vertical signal lines 58. The column circuits 53 receive the signals output from the respective pixels 6 on the selected row for each pixel column of the pixel array unit 51, and each executes, for the signal, signal processing such as correlated double sampling (CDS) for removing fixed pattern noise specific to the pixel, signal amplification, and AD conversion.

In this example, the column circuits 53 are so disposed as to have one-to-one correspondence with respect to the pixel columns. However, the circuit configuration is not limited thereto. For example, it is also possible to employ a configuration in which one column circuit 53 is disposed per plural pixel columns (vertical signal lines 58) and each of the column circuits 53 is shared by the plural pixel columns in a time-division manner.

The horizontal drive circuit 54 is composed of shift registers, address decoders, and so on, and sequentially outputs a horizontal scanning pulse to thereby select the column circuits 53 in turn. For each of the output stages of the column circuits 53, a horizontal selection switch is so provided as to be connected between the output stage and a horizontal signal line 59, although not shown in the diagram. The horizontal scanning pulse sequentially output from the horizontal drive circuit 54 turns on the horizontal selection switches provided for the respective output stages of the column circuits 53 in turn. These horizontal selection switches are turned on in turn in response to the horizontal scanning pulse to thereby allow pixel signals processed by the column circuits 53 on each pixel column basis to be output to the horizontal signal line 59 in turn.

The output circuit 55 executes various kinds of signal processing for the pixel signals supplied from the column circuits 53 via the horizontal signal line 59 in turn and outputs the resulting signals. As specific signal processing by the output circuit 55, e.g. merely buffering is executed in some cases. Alternatively, before the buffering, black level adjustment, correction of variation among the columns, signal amplification, processing relating to the color, and so on are carried out in other cases.

The timing generator 56 generates various kinds of timing signals and controls driving of the vertical drive circuit 52, the column circuits 53, and the horizontal drive circuit 54 based on these various kinds of timing signals.

[Circuit Configuration of Unit Pixel]

Figure 5:
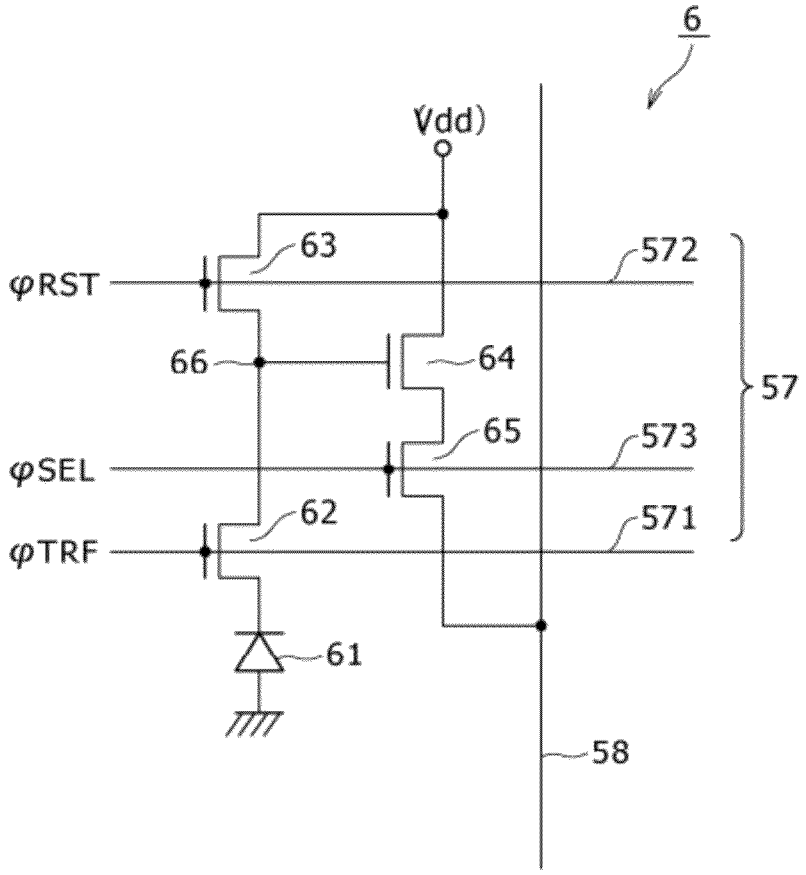
FIG. 5 is a circuit diagram showing one example of the circuit configuration of a unit pixel.

FIG. 5 is a circuit diagram showing one example of the circuit configuration of the unit pixel. The unit pixel 6 relating to the present circuit example has, in addition to the photoelectric conversion element serving as the light receiving part, such as a photodiode 61, e.g. four transistors of a transfer transistor 62, a reset transistor 63, an amplification transistor 64, and a selection transistor 65.

In this example, e.g. N-channel MOS transistors are used as these transistors 62 to 65. However, the combination of the conductivity type of the transfer transistor 62, the reset transistor 63, the amplification transistor 64, and the selection transistor 65 in this example is merely one example and the combination of the conductivity type is not limited thereto.

For this unit pixel 6, as the pixel drive line 57, e.g. three drive interconnects of a transfer line 571, a reset line 572, and a selection line 573 are provided in common to the respective pixels on the same pixel row. One end of each of the transfer line 571, the reset line 572, and the selection line 573 is connected to the output terminal of the vertical drive circuit 52, corresponding to the pixel row, on each pixel row basis.

The anode of the photodiode 61 is connected to the negative-side power supply such as the ground, and carries out photoelectric conversion of received light to a photo-charge (photoelectrons, in this example) with the amount of charge dependent on the amount of received light. The cathode electrode of the photodiode 61 is electrically connected to the gate electrode of the amplification transistor 64 via the transfer transistor 62. The node electrically connected to the gate electrode of the amplification transistor 64 is referred to as a floating diffusion (FD) part (charge voltage converter) 66.

The transfer transistor 62 is connected between the cathode electrode of the photodiode 61 and the FD part 66. The transfer transistor 62 is turned to the on-state in response to supply of a transfer pulse φTRF whose high level (e.g. Vdd level) corresponds to the active state (hereinafter, such a pulse will be represented as a "High-active pulse") to the gate electrode via the transfer line 571. Thereby, the transfer transistor 62 transfers the photo-charge arising from the photoelectric conversion by the photodiode 61 to the FD part 66.

The drain electrode of the reset transistor 63 is connected to the pixel power supply Vdd, and the source electrode thereof is connected to the FD part 66. The reset transistor 63 is turned to the on-state in response to supply of a High-active reset pulse φRST to the gate electrode via the reset line 572. Thereby, prior to the transfer of the signal charge from the photodiode 61 to the FD part 66, the reset transistor 63 discards the charge of the FD part 66 toward the pixel power supply Vdd to thereby reset the FD part 66.

The gate electrode of the amplification transistor 64 is connected to the FD part 66, and the drain electrode thereof is connected to the pixel power supply Vdd. The amplification transistor 64 outputs the potential of the FD part 66 obtained after the reset by the reset transistor 63 as the reset level. In addition, the amplification transistor 64 outputs the potential of the FD part 66 obtained after the transfer of the signal charge by the transfer transistor 62 as the signal level.

For example, the drain electrode of the selection transistor 65 is connected to the source of the amplification transistor 64, and the source electrode thereof is connected to the vertical signal line 58. The selection transistor 65 is turned to the on-state in response to supply of a High-active selection pulse φSEL to the gate via the selection line 573. Thereby, the selection transistor 65 sets the unit pixel 6 to the selected state and relays the signal output from the amplification transistor 64 to the vertical signal line 58.

It is also possible to employ a circuit configuration in which the selection transistor 65 is connected between the pixel power supply Vdd and the drain of the amplification transistor 64.

Furthermore, the unit pixel 6 is not limited to that having the pixel configuration formed of four transistors with the above-described configuration but may be one having a pixel configuration formed of three transistors one of which serves as both the amplification transistor 64 and the selection transistor 65. The configuration of the pixel circuit thereof may be any.

[CCD Sensor]

Figure 6A:
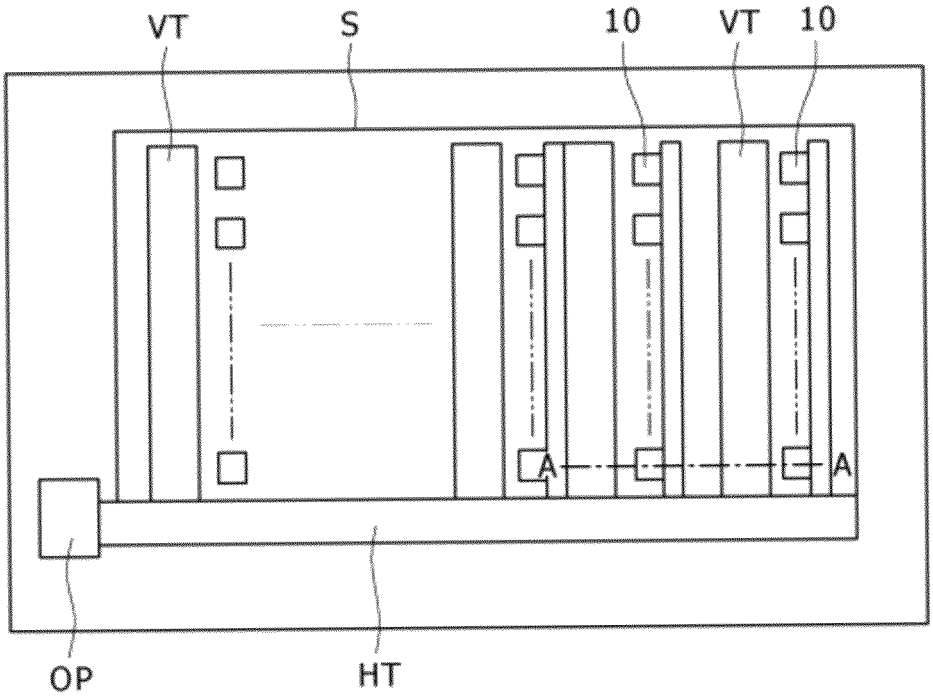
FIGS. 6A and 6B are schematic diagrams for explaining a CCD sensor.
Figure 6B:
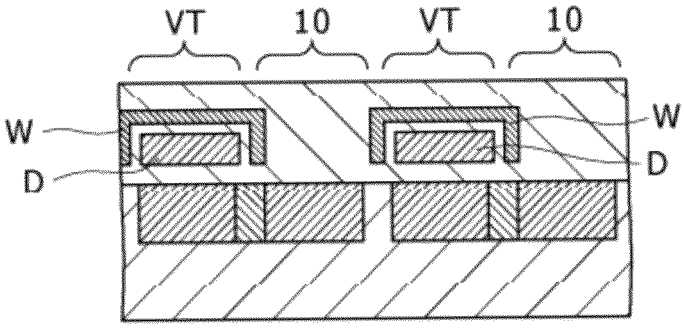

FIGS. 6A and 6B are schematic diagrams for explaining a charge coupled device (CCD) sensor: FIG. 6A is an overall plan view and FIG. 6B is a sectional view along line A-A in FIG. 6A. As shown in FIG. 6A, this solid-state imaging device 1 includes plural pixels 10 arranged in a matrix in an imaging area S and plural vertical transfer registers VT that correspond to the columns of the pixels 10 and have a CCD structure. Furthermore, this solid-state imaging device 1 includes a horizontal transfer register HT that has a CCD structure and transfers a signal charge transferred by the vertical transfer register VT to an output unit, and an output unit OP connected to the final stage of the horizontal transfer register HT.

In this solid-state imaging device 1, a charge is accumulated depending on the light received by the pixel 10, and this charge is read out to the vertical transfer register VT at a predetermined timing and is sequentially transferred by voltage with plural phases applied from electrodes above the vertical transfer register VT. Furthermore, the charge reaching the horizontal transfer register HT is sequentially transferred to the output unit OP and is output as predetermined voltage from the output unit OP.

As shown in FIG. 6B, electrodes D are provided for the vertical transfer register VT. The electrodes D are formed in plural layers although not shown in the diagram. The electrodes D are so provided that the adjacent electrodes D partially overlap with each other. Voltage with different phases is sequentially applied to these plural electrodes D. Thereby, the charge accumulated in the pixel 10 is read out and transferred in the vertical direction. A light blocking part W is formed for the electrode D for the vertical transfer register VT provided between the pixels 10 to thereby suppress the incidence of unnecessary light.

[Layout in Imaging Area]

Figure 7:
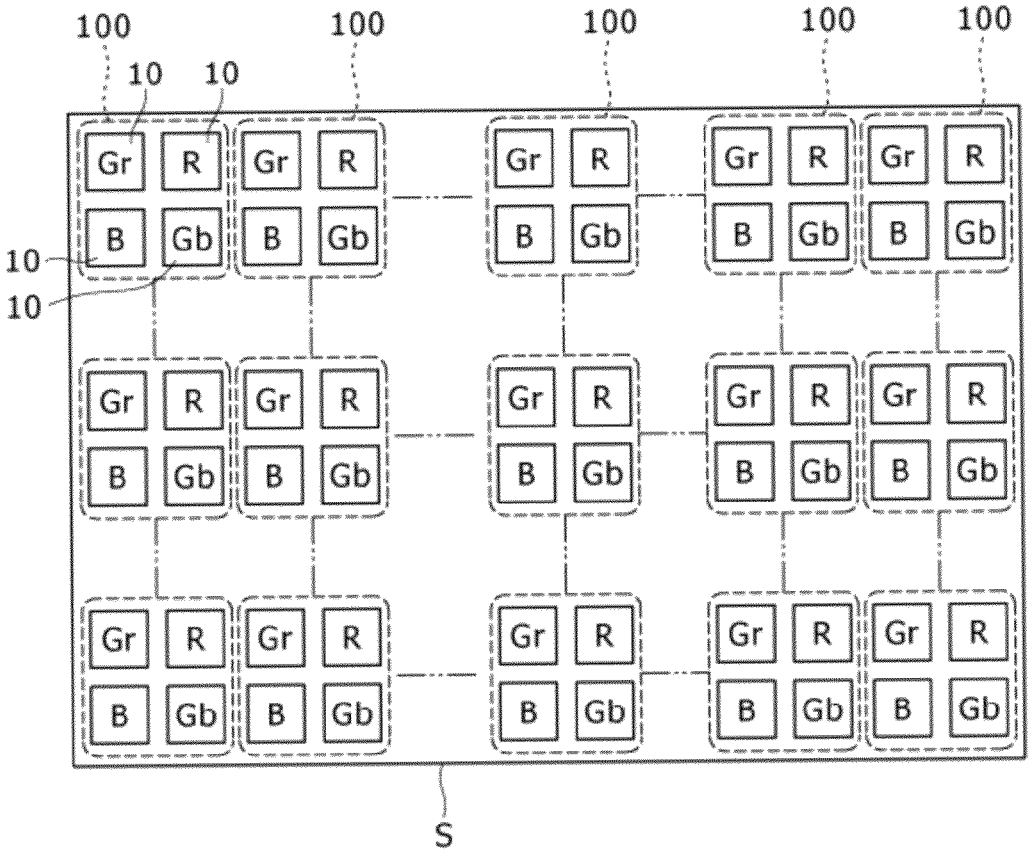
FIG. 7 is a schematic plan view for explaining the layout in an imaging area.

FIG. 7 is a schematic plan view for explaining the layout in the imaging area. In any of the above-described configuration examples, the plural pixels 10 are disposed in a matrix in the imaging area S. Each pixel 10 receives light of the color necessary for obtaining a color image due to the color filter. As the colors, e.g. the combination of red (R), green (G), and blue (B) or the combination of yellow (Y), cyan (C), magenta (M), and green (G) is used. In the embodiments, the combination of red (R), green (G), and blue (B) is employed as an example.

The respective pixels 10 in the imaging area S are disposed with predetermined arrangement so as to each capture light of any of the colors of red (R), green (G), and blue (B). There are various kinds of arrangement as the corresponding color arrangement. In the embodiments, the Bayer array, in which red (R), blue (B), first green (Gr), and second green (Gb) are disposed in a 2×2 matrix vertically and horizontally, is employed as an example. In this array, one pixel unit 100 is configured by total four pixels 10, i.e. 2×2 pixels of red (R), blue (B), first green (Gr), and second green (Gb). Although first green (Gr) and second green (Gb) are allocated to different pixels, the pixels treat the same color. In the imaging area S, plural pixel units 100 are arranged in a matrix.

2. Energy Profile

[Profile in Pixel Unit]

Figure 8:
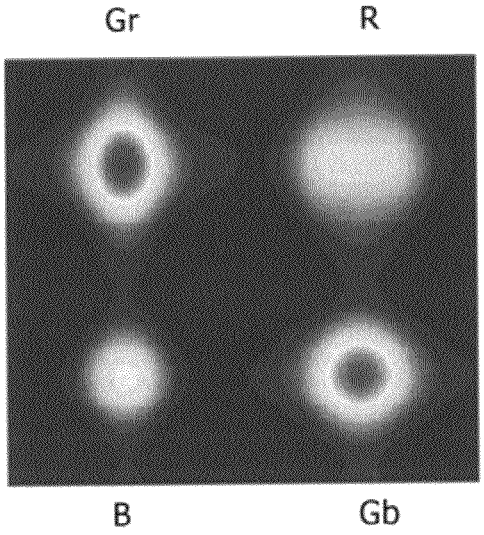
FIG. 8 is a diagram showing an example of the energy profile in a pixel unit.

FIG. 8 is a diagram showing an example of the energy profile in the pixel unit. This diagram shows the intensity and spread of the irradiation energy on the silicon substrate surface, of the respective colors (wavelengths) of B, R, Gr, and Gb. According to this diagram, the light of blue (B) has the highest intensity and smallest spread of the irradiation energy. On the other hand, the light of red (R) has the lowest intensity and largest spread of the irradiation energy.

[Change Dependent on Image Height]

Figure 9A:
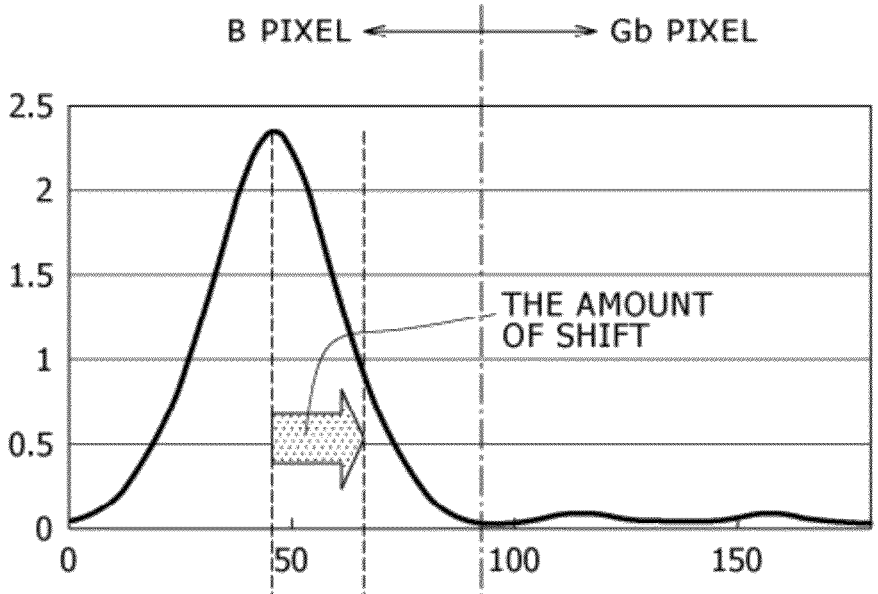
FIGS. 9A and 9B are (first) diagrams for explaining change in the energy profile dependent on the image height.
Figure 9B:
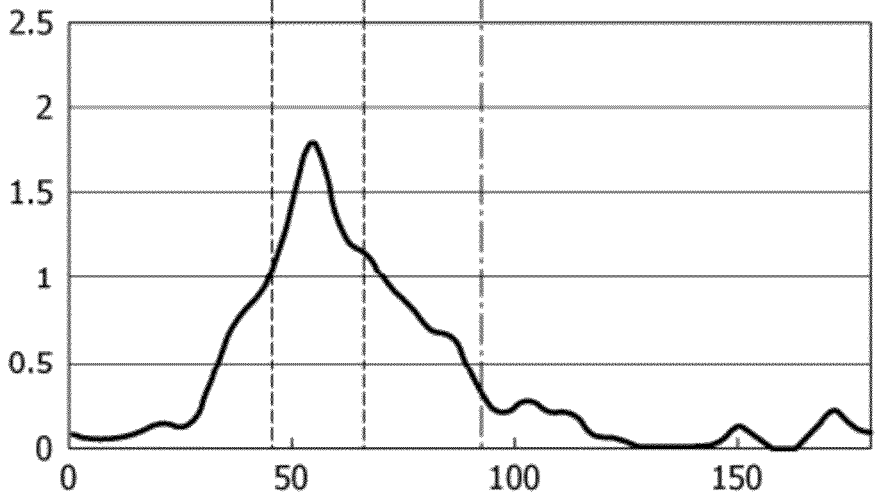
Figure 10A:
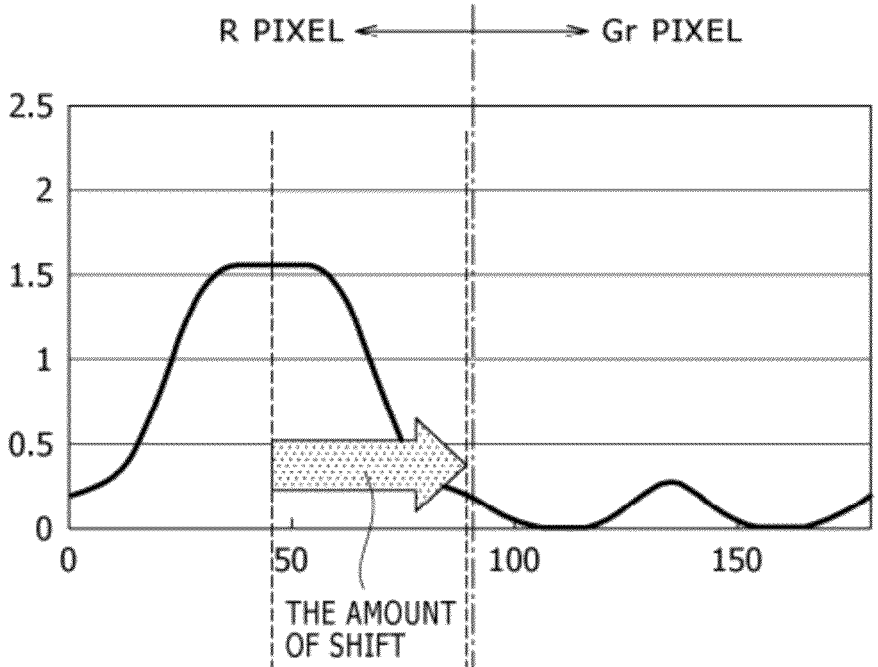
FIGS. 10A and 10B are (second) diagrams for explaining change in the energy profile dependent on the image height.
Figure 10B:
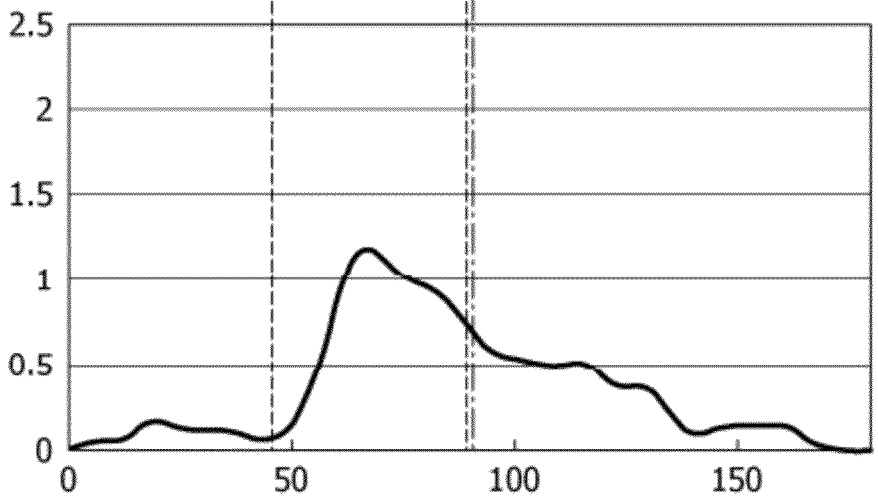

FIGS. 9A to 10B are diagrams for explaining change in the energy profile dependent on the image height. FIGS. 9A and 9B show the energy profiles of a blue (B) pixel and a green (Gb) pixel. FIGS. 10A and 10B show the energy profiles of a red (R) pixel and a green (Gr) pixel. In FIGS. 9A to 10B, FIGS. 9A and 10A show the state when the image height is 0% (at the center of the imaging area), and FIGS. 9B and 10B show the state when the image height is 100% (at an edge of the imaging area).

This energy profiles are obtained from the back-illuminated CMOS sensor having the light blocking part W, shown in FIG. 2. Specifically, this back-illuminated CMOS sensor has a layer configuration including the following components over the silicon substrate 2, in which the light receiving regions formed of photodiodes are formed: an HfO film (64-nm thickness) as the antireflection film 21, a tungsten film (150-nm thickness) as the light blocking part W, an $SiO_2$ film (550-nm thickness) as the interlayer insulating film 30, the color filter 60 (500-nm thickness), and the microlenses 70 (750-nm thickness (the lens part thickness is 350 nm)).

Figure 11:
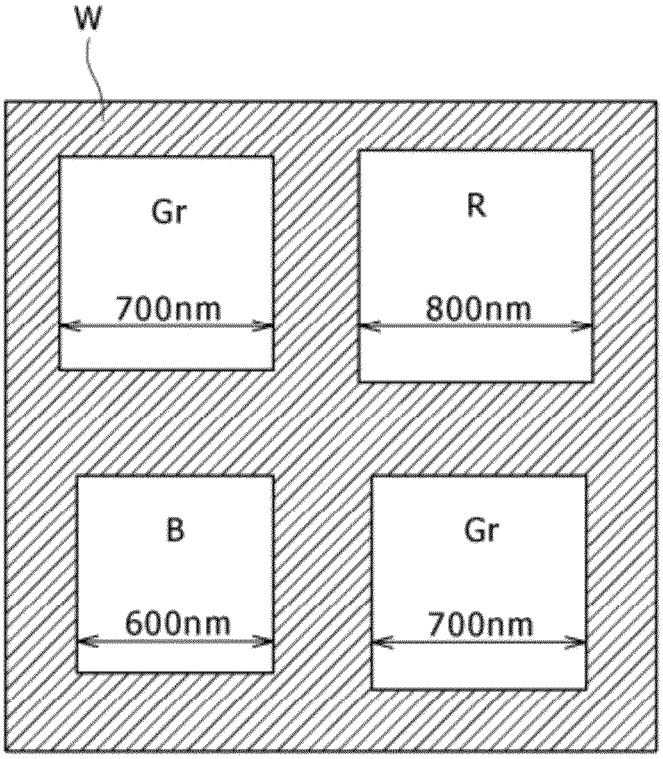
FIG. 11 is a schematic diagram showing plan view of apertures of a light blocking part.

The plan view of the apertures of the light blocking part W is as shown in FIG. 11. The aperture size is made different for each of the RGB colors in order to regulate the output balance based on the energy profile shown in FIG. 8. For example, the aperture corresponding to red (R) has a size of 800 nm square. The aperture corresponding to green (Gr, Gb) has a size of 700 nm square. The aperture corresponding to blue (B) has a size of 600 nm square. Furthermore, the pixel size in plan view (light reception area) is 0.9 μm square, and the color filter arrangement is based on the Bayer array.

The sectional view of the energy profile made directly above the light blocking part in this pixel structure corresponds to FIGS. 9A to 10B. FIGS. 9A and 9B show the result of simulation with single-color light with a wavelength of 450 nm (blue), and FIGS. 10A and 10B show result of simulation with single-color light with a wavelength of 650 nm (red). In each simulation, the pixel is irradiated with collimated light.

FIG. 9A and FIG. 10A show the energy profiles when the image height is 0% (at the center of the imaging area). The energy spread of the red (R) pixel shown in FIG. 10A is larger than that of the blue (B) pixel shown in FIG. 9A.

FIG. 9B and FIG. 10B show the energy profiles when the image height is 100% (at an edge of the imaging area). The energy profiles are based on the assumption that a lens whose main light beam incidence angle is 20° when the image height is 100% is used. Both in the red (R) and in the blue (B), the light energy is not concentrated at the pixel center but in a shifted state.

For example, according to the profile shown in FIG. 9B, the light that should be received by the blue (B) pixel enters the adjacent second-green (Gb) pixel. Furthermore, according to the profile shown in FIG. 10B, the light that should be received by the red (R) pixel enters the adjacent first-green (Gr) pixel. In this manner, the energy profile changes depending on the image height and the center is shifted, which causes sensitivity deterioration and color cross-talk.

Specific embodiments of the present invention will be described below. Any of the above-described configuration examples can be applied to solid-state imaging devices according to the embodiments. The following description will be made by taking solid-state imaging devices each employing a back-illuminated CMOS sensor as an example.

3. First Embodiment

Figure 12:
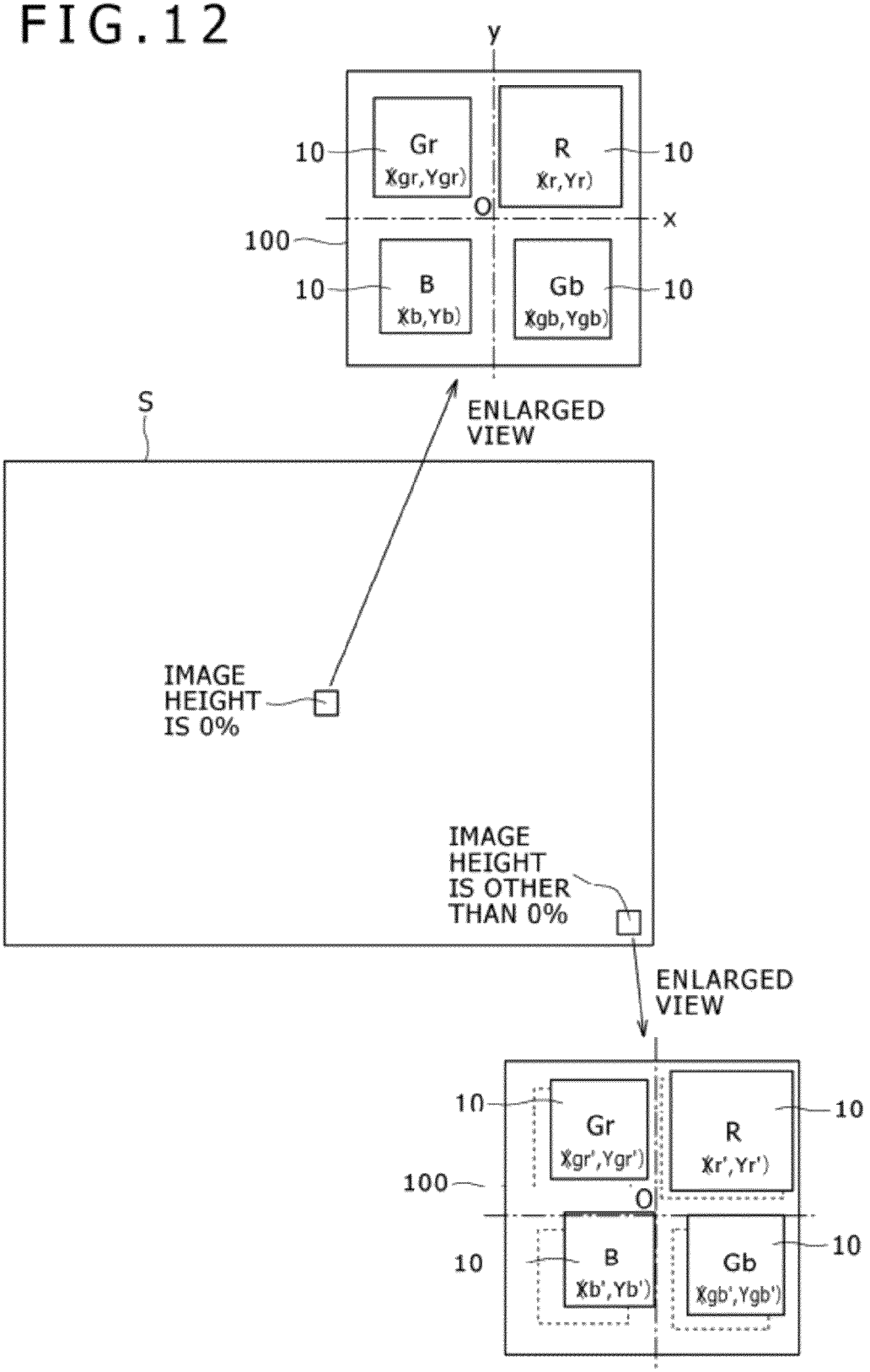
FIG. 12 is a schematic diagram for explaining a first embodiment of the present invention.

FIG. 12 is a schematic diagram for explaining a first embodiment. In a solid-state imaging device according to the first embodiment, the amount of shift is set for the position of the pixels 10 of the respective colors in the pixel unit 100 depending on the distance from the center of the imaging area S, i.e. the image height. This amount of shift is so set as to differ from color to color.

In FIG. 12, an enlarged view of each of the pixel unit 100 corresponding to the position at which the image height is 0% and the pixel unit 100 corresponding to the position at which the image height is other than 0% is shown. In each pixel unit 100, four pixels 10 in the pixel unit 100 are disposed at predetermined positions on the basis of the center O of the pixel unit 100.

For four pixels 10 in the pixel unit 100 corresponding to the position at which the image height is 0%, the center positions of the respective pixels 10 in the xy coordinate system whose origin is the center O of the pixel unit 100 are shown as follows.

the center position of the R pixel 10 . . . (Xr, Yr)
the center position of the Gr pixel 10 . . . (Xgr, Ygr)
the center position of the B pixel 10 . . . (Xb, Yb)
the center position of the Gb pixel 10 . . . (Xgb, Ygb)

For four pixels 10 in the pixel unit 100 corresponding to the position at which the image height is 100%, the center positions of the respective pixels 10 in the xy coordinate system whose origin is the center O of the pixel unit 100 are shown as follows.

the center position of the R pixel 10 . . . (Xr', Yr')
the center position of the Gr pixel 10 . . . (Xgr', Ygr')
the center position of the B pixel 10 . . . (Xb', Yb')
the center position of the Gb pixel 10 . . . (Xgb', Ygb')

In the solid-state imaging device 1, the amount of shift is set for the position of the pixels 10 of the corresponding colors in the pixel unit 100 depending on the image height. This feature is response to the characteristic that the center position of the energy profile is shifted depending on the image height as shown in FIGS. 9A to 10B.

The amounts of shift of the pixels 10 of the respective colors in the pixel unit 100 dependent on the image height are as follows.

(the amount ΔR of shift of the R pixel)

$$\Delta R=\sqrt{(Xr'-Xr)^2+(Yr'-Yr)^2}$$

(the amount ΔGr of shift of the Gr pixel)

$$\Delta Gr=\sqrt{(Xgr'-Xgr)^2+(Ygr'-Ygr)^2}$$

(the amount ΔB of shift of the B pixel)

$$\Delta B=\sqrt{(Xb'-Xb)^2+(Yb'-Yb)^2}$$

(the amount ΔGb of shift of the Gb pixel)

$$\Delta Gb=\sqrt{(Xgb'-Xgb)^2+(Ygb'-Ygb)^2}$$

In the solid-state imaging device of the first embodiment, the amount ΔR of shift of the R pixel, the amount ΔGr of shift of the Gr pixel, the amount ΔB of shift of the B pixel, and the amount ΔGb of shift of the Gb pixel are so set as to differ corresponding to the respective colors. Specifically, the amount of shift of the center position of the energy profile dependent on the image height is obtained in advance for each of the colors of red (R), green (G), and blue (B). In matching with these amounts of shift, the values of ΔR, ΔGr, ΔB, and ΔGb are set on a color-by-color basis.

Specifically, the value of ΔR is set in matching with the shift of the center position of the energy profile in red (R) dependent on the image height. The values of ΔGr and ΔGb are set in matching with the shift of the center position of the energy profile in green (G) dependent on the image height. The value of ΔB is set in matching with the shift of the center position of the energy profile in blue (B) dependent on the image height. Thereby, the color shift in each pixel unit 100 is suppressed over the area from the center of the imaging area S to the periphery thereof.

The directions of the movement of the respective pixels 10 based on ΔR, ΔGr, ΔB, and ΔGb are directions toward the position at which the image height is 0%. The values of ΔR, ΔGr, ΔB, and ΔGb can be obtained from functions including the image height as a variable or can be obtained from table data.

4. Second Embodiment

Figure 13:
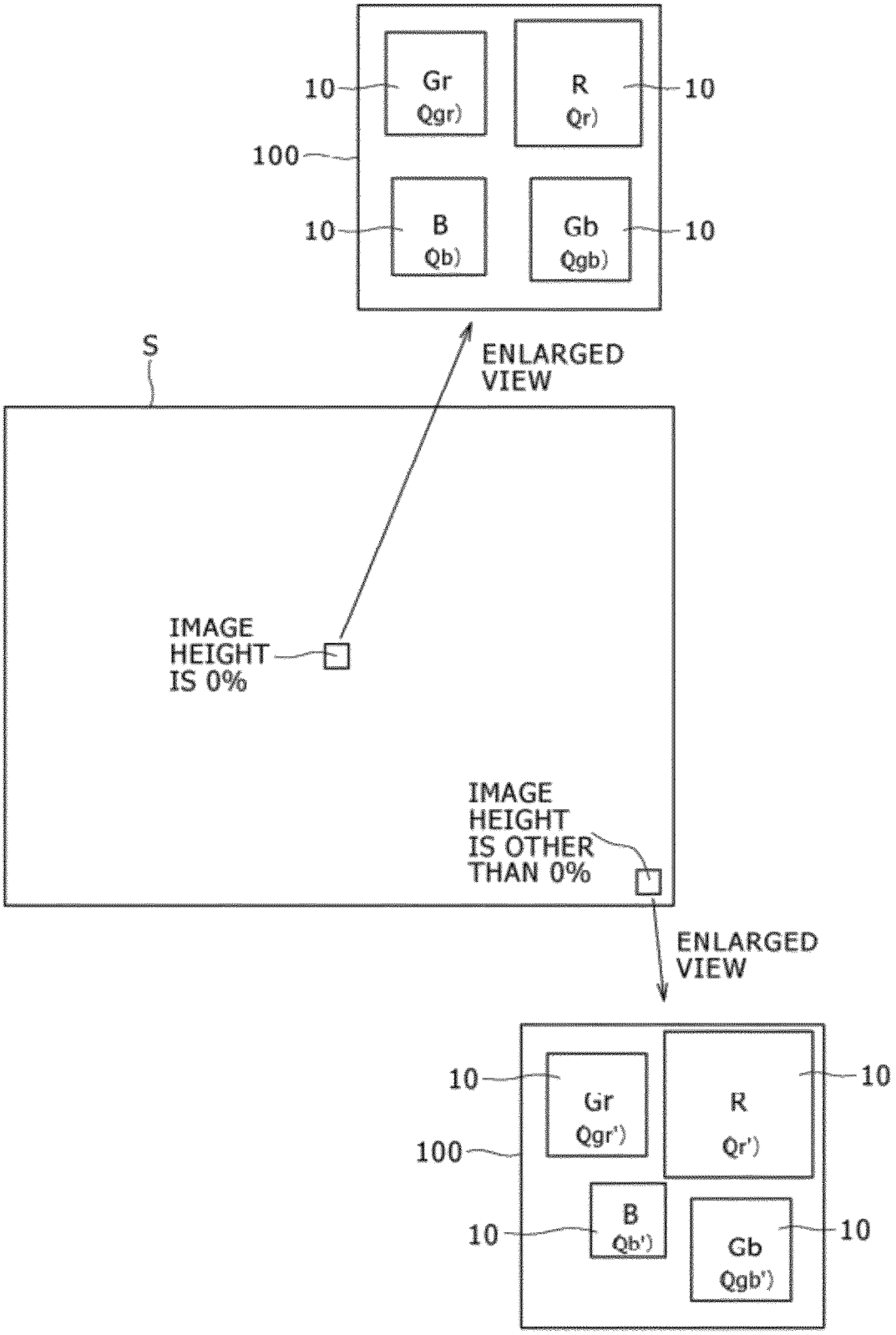
FIG. 13 is a schematic diagram for explaining a second embodiment of the present invention.

FIG. 13 is a schematic diagram for explaining a second embodiment. In a solid-state imaging device according to the second embodiment, in addition to the configuration of the first embodiment, difference is set in the magnitude of the light reception area of the pixels 10 of the respective colors in the pixel unit 100 depending on the image height, and the difference in the magnitude is so set as to differ from color to color.

In FIG. 13, an enlarged view of each of the pixel unit 100 corresponding to the position at which the image height is 0% and the pixel unit 100 corresponding to the position at which the image height is other than 0% is shown. In each pixel unit 100, four pixels 10 in the pixel unit 100 are provided with the respective light reception areas.

For four pixels 10 in the pixel unit 100 corresponding to the position at which the image height is 0%, the light reception areas of the respective pixels 10 are shown as follows.

the light reception area of the R pixel 10 . . . Qr
the light reception area of the Gr pixel 10 . . . Qgr
the light reception area of the B pixel 10 . . . Qb
the light reception area of the Gb pixel 10 . . . Qgb For four pixels 10 in the pixel unit 100 corresponding to the position at which the image height is 100%, the light reception areas of the respective pixels 10 are shown as follows.

the light reception area of the R pixel 10 . . . Qr'
the light reception area of the Gr pixel 10 . . . Qgr'
the light reception area of the B pixel 10 . . . Qb'
the light reception area of the Gb pixel 10 . . . Qgb'

In the solid-state imaging device 1, difference is set in the magnitude of the light reception area of the pixels 10 of the corresponding colors in the pixel unit 100 depending on the image height. This feature is response to the characteristic that the spread of the energy profile changes depending on the image height as shown in FIGS. 9A to 10B.

The differences in the magnitude of the light reception area of the pixels 10 of the respective colors in the pixel unit 100 dependent on the image height are as follows.

(the difference ΔQR in the magnitude of the light reception area of the R pixel)

$$\Delta QR=Qr'-Qr$$

(the difference ΔQGr in the magnitude of the light reception area of the Gr pixel)

$$\Delta QGr=Qgr'-Qgr$$

(the difference ΔQB in the magnitude of the light reception area of the B pixel)

$$\Delta QB=Qb'-Qb$$

(the difference ΔQGb in the magnitude of the light reception area of the Gb pixel)

$$\Delta QGb=Qgb'-Qgb$$

In the solid-state imaging device of the second embodiment, the values of ΔQR, ΔQGr, ΔQB, and ΔQGb are so set as to differ corresponding to the respective colors. Specifically, the change in the spread of the energy profile dependent on the image height is obtained in advance for each of the colors of red (R), green (G), and blue (B). In matching with these changes, the values of ΔQR, ΔQGr, ΔQB, and ΔQGb are set on a color-by-color basis.

Specifically, the value of ΔQR is set in matching with the change in the spread of the energy profile in red (R) dependent on the image height. The values of ΔQGr and ΔQGb are set in matching with the change in the spread of the energy profile in green (G) dependent on the image height. The value of ΔQB is set in matching with the change in the spread of the energy profile in blue (B) dependent on the image height. Thereby, the color shift in each pixel unit 100 is suppressed over the area from the center of the imaging area S to the periphery thereof.

The values of ΔQR, ΔQGr, ΔQB, and ΔQGb can be obtained from functions including the image height as a variable or can be obtained from table data.

5. Third Embodiment

Figure 14:
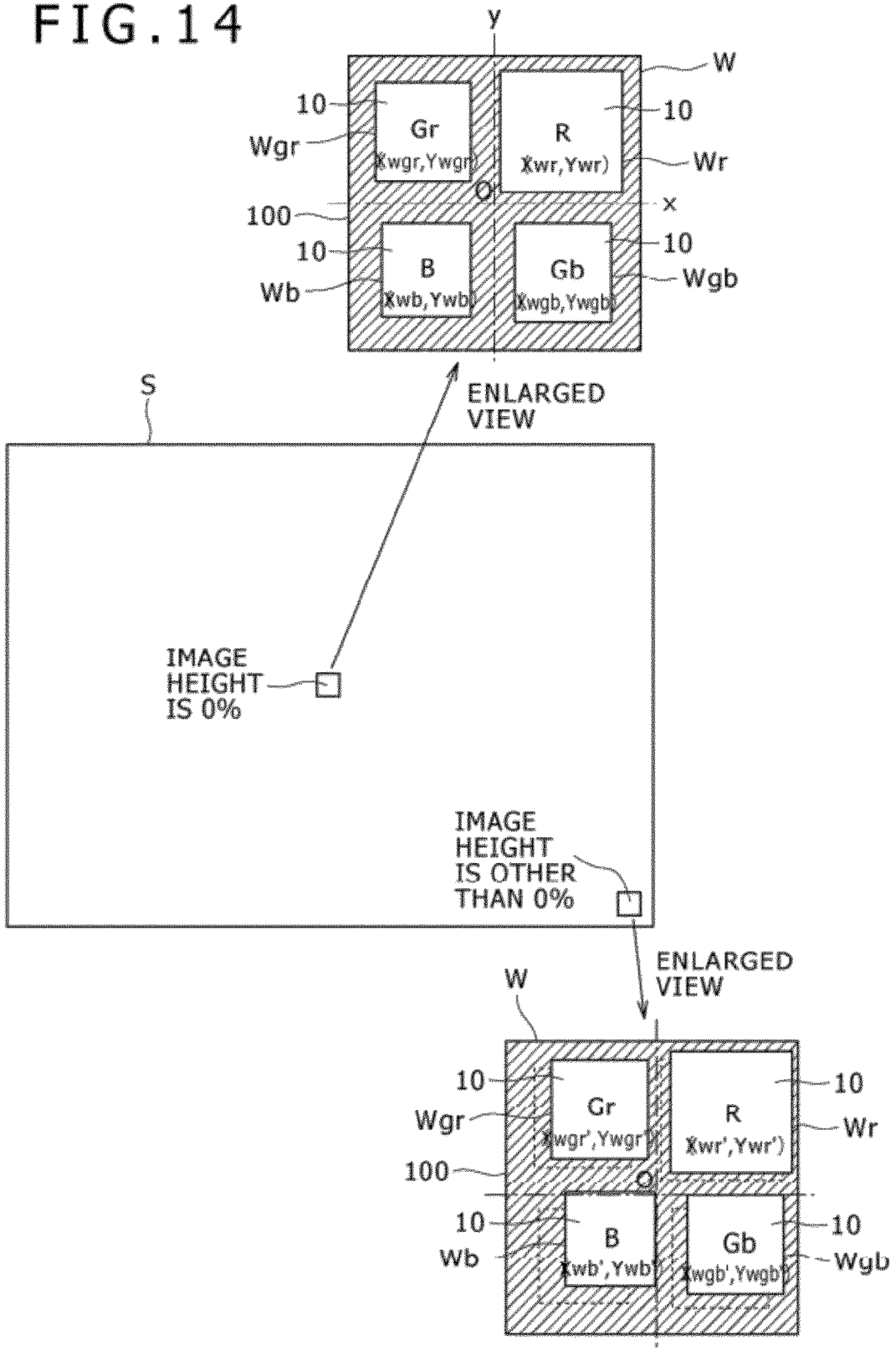
FIG. 14 is a schematic diagram for explaining a third embodiment of the present invention.

FIG. 14 is a schematic diagram for explaining a third embodiment. In a solid-state imaging device according to the third embodiment, the amount of shift is set for the position of the apertures of a light blocking part W for the corresponding pixels in each pixel unit 100. This amount of shift is so set as to differ from color to color.

In FIG. 14, an enlarged view of each of the pixel unit 100 corresponding to the position at which the image height is 0% and the pixel unit 100 corresponding to the position at which the image height is other than 0% is shown. In each pixel unit 100, the apertures of the light blocking part W corresponding to four pixels 10 in the pixel unit 100 are disposed at predetermined positions on the basis of the center O of the pixel unit 100.

For four pixels 10 in the pixel unit 100 corresponding to the position at which the image height is 0%, the center positions of the apertures of the light blocking part W for the respective pixels 10 in the xy coordinate system whose origin is the center O of the pixel unit 100 are shown as follows.

the aperture Wr of the light blocking part W for the R pixel 10 . . . (Xwr, Ywr)

the aperture Wgr of the light blocking part W for the Gr pixel 10 . . . (Xwgr, Ywgr)

the aperture Wb of the light blocking part W for the B pixel 10 . . . (Xwb, Ywb)

the aperture Wgb of the light blocking part W for the Gb pixel 10 . . . (Xwgb, Ywgb)

For four pixels 10 in the pixel unit 100 corresponding to the position at which the image height is 100%, the center positions of the apertures of the light blocking part W for the respective pixels 10 in the xy coordinate system whose origin is the center O of the pixel unit 100 are shown as follows.

the aperture Wr of the light blocking part W for the R pixel 10 . . . (Xwr', Ywr')

the aperture Wgr of the light blocking part W for the Gr pixel 10 . . . (Xwgr', Ywgr')

the aperture Wb of the light blocking part W for the B pixel 10 . . . (Xwb', Ywb')

the aperture Wgb of the light blocking part W for the Gb pixel 10 . . . (Xwgb', Ywgb')

In the solid-state imaging device 1, the amount of shift is set for the position of the apertures of the light blocking part W for the pixels 10 of the corresponding colors in the pixel unit 100 depending on the image height. This feature is response to the characteristic that the center position of the energy profile is shifted depending on the image height as shown in FIGS. 9A to 10B.

The amounts of shift for the pixels 10 of the respective colors in the pixel unit 100 dependent on the image height are as follows.

(the amount ΔWR of shift of the aperture Wr for the R pixel)

$$\Delta WR=\sqrt{(Xwr'-Xwr)^2+(Ywr'-Ywr)^2}$$

(the amount ΔWGr of shift of the aperture Wgr for the Gr pixel)

$$\Delta WGr=\sqrt{(Xwgr'-Xwgr)^2+(Ywgr'-Ywgr)^2}$$

(the amount ΔWB of shift of the aperture Wb for the B pixel)

$$\Delta WB=\sqrt{(Xwb'-Xwb)^2+(Ywb'-Ywb)^2}$$

(the amount ΔWGb of shift of the aperture Wgb for the Gb pixel)

$$\Delta WGb=\sqrt{(Xwgb'-Xwgb)^2+(Ywgb'-Ywgb)^2}$$

In the solid-state imaging device of the third embodiment, the above-described ΔWR, ΔWGr, ΔWB, and ΔWGb are so set as to differ corresponding to the respective colors. Specifically, the amount of shift of the center position of the energy profile dependent on the image height is obtained in advance for each of the colors of red (R), green (G), and blue (B). In matching with these amounts of shift, the values of ΔWR, ΔWGr, ΔWB, and ΔWGb are set on a color-by-color basis.

Specifically, the value of ΔWR is set in matching with the shift of the center position of the energy profile in red (R) dependent on the image height. The values of ΔWGr and ΔWGb are set in matching with the shift of the center position of the energy profile in green (G) dependent on the image height. The value of ΔWB is set in matching with the shift of the center position of the energy profile in blue (B) dependent on the image height. Thereby, the color shift in each pixel unit 100 is suppressed over the area from the center of the imaging area S to the periphery thereof.

The directions of the movement of the respective apertures based on ΔWR, ΔWGr, ΔWB, and ΔWGb are directions toward the position at which the image height is 0%. The values of ΔWR, ΔWGr, ΔWB, and ΔWGb can be obtained from functions including the image height as a variable or can be obtained from table data.

6. Fourth Embodiment

Figure 15:
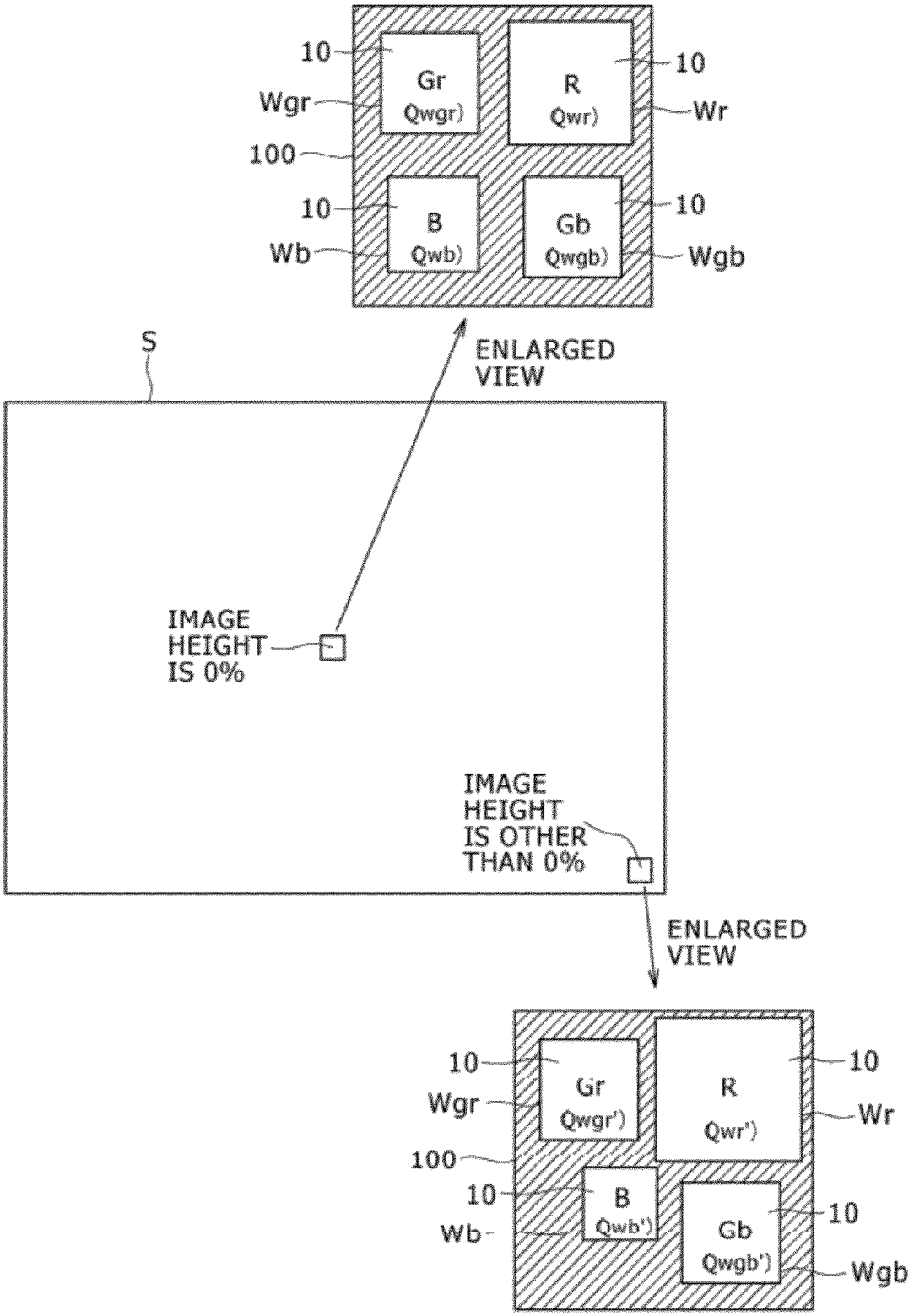
FIG. 15 is a schematic diagram for explaining a fourth embodiment of the present invention.

FIG. 15 is a schematic diagram for explaining a fourth embodiment. In a solid-state imaging device according to the fourth embodiment, in addition to the configuration of the third embodiment, difference is set in the size of the apertures of the light blocking part W for the pixels 10 of the respective colors in the pixel unit 100 depending on the image height, and the difference in the size is so set as to differ from color to color.

In FIG. 15, an enlarged view of each of the pixel unit 100 corresponding to the position at which the image height is 0% and the pixel unit 100 corresponding to the position at which the image height is other than 0% is shown. In each pixel unit 100, the apertures of the light blocking part W for four pixels 10 in the pixel unit 100 are provided with the respective sizes.

For four pixels 10 in the pixel unit 100 corresponding to the position at which the image height is 0%, the sizes of the apertures of the light blocking part W for the respective pixels 10 are shown as follows.

the size of the aperture Wr of the light blocking part W for the R pixel 10 . . . Qwr the size of the aperture Wgr of the light blocking part W for the Gr pixel 10 . . . Qwgr the size of the aperture Wb of the light blocking part W for the B pixel 10 . . . Qwb the size of the aperture Wgb of the light blocking part W for the Gb pixel 10 . . . Qwgb For four pixels 10 in the pixel unit 100 corresponding to the position at which the image height is 100%, the sizes of the apertures of the light blocking part W for the respective pixels 10 are shown as follows.

the size of the aperture Wr of the light blocking part W for the R pixel 10 . . . Qwr' the size of the aperture Wgr of the light blocking part W for the Gr pixel 10 . . . Qwgr' the size of the aperture Wb of the light blocking part W for the B pixel 10 . . . Qwb' the size of the aperture Wgb of the light blocking part W for the Gb pixel 10 . . . Qwgb'

In the solid-state imaging device 1, difference is set in the size of the apertures of the light blocking part W for the pixels 10 of the corresponding colors in the pixel unit 100 depending on the image height. This feature is response to the characteristic that the spread of the energy profile changes depending on the image height as shown in FIGS. 9A to 10B.

The differences in the size of the aperture of the light blocking part W for the pixels 10 of the respective colors in the pixel unit 100 dependent on the image height are as follows.

(the difference ΔQWR in the size of the aperture Wr for the R pixel)

$$\Delta QWR = Qwr' - Qwr$$

(the difference ΔQWGr in the size of the aperture Wgr for the Gr pixel)

$$\Delta QWGr = Qwgr' - Qwgr$$

(the difference ΔQWB in the size of the aperture Wb for the B pixel)

$$\Delta QWB = Qwb' - Qwb$$

(the difference ΔQWGb in the size of the aperture Wgb for the Gb pixel)

$$\Delta QWGb = Qwgb' - Qwgb$$

In the solid-state imaging device of the fourth embodiment, the values of ΔQWR, ΔQWGr, ΔQWB, and ΔQWGb are so set as to differ corresponding to the respective colors. Specifically, the change in the spread of the energy profile dependent on the image height is obtained in advance for each of the colors of red (R), green (G), and blue (B). In matching with these changes, the values of ΔQWR, ΔQWGr, ΔQWB, and ΔQWGb are set on a color-by-color basis.

Specifically, the value of ΔQWR is set in matching with the change in the spread of the energy profile in red (R) dependent on the image height. The values of ΔQWGr and ΔQWGb are set in matching with the change in the spread of the energy profile in green (G) dependent on the image height. The value of ΔQWB is set in matching with the change in the spread of the energy profile in blue (B) dependent on the image height. Thereby, the color shift in each pixel unit 100 is suppressed over the area from the center of the imaging area S to the periphery thereof.

The values of ΔQWR, ΔQWGr, ΔQWB, and ΔQWGb can be obtained from functions including the image height as a variable or can be obtained from table data.

The above-described first to fourth embodiments may be each independently employed and may be employed in appropriate combination. Specifically, the setting of the positions of the pixels according to the first embodiment may be combined with the setting of the positions of the apertures of the light blocking part for the pixels according to the third embodiment. Furthermore, the setting of the positions of the pixels according to the first embodiment may be combined with the setting of the sizes of the apertures of the light blocking part for the pixels according to the fourth embodiment. In addition, the setting of the light reception areas of the pixels according to the second embodiment may be combined with the setting of the positions of the apertures of the light blocking part for the pixels according to the third embodiment.

Figure 16:
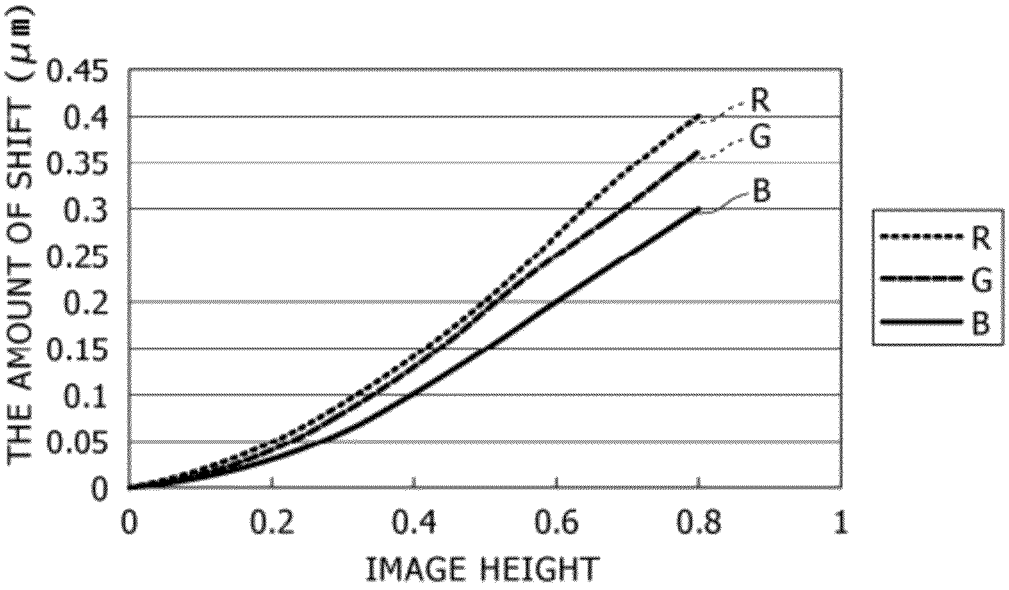
FIG. 16 is a diagram for explaining difference in the amount of shift from color to color.

FIG. 16 is a diagram for explaining the difference in the amount of shift from color to color. In this diagram, the image height is indicated on the abscissa and the amount of shift of the position of the pixel and the position of the aperture of the light blocking part in the pixel unit is indicated on the ordinate. The amount of shift is larger in the order of red (R), green (G), and blue (B), and the difference reaches about 0.1 μm when the image height is 100%. In the embodiments, in matching with the amount of shift in which the difference arises among the respective colors of RGB, the amount of shift of the position of the pixel and the position of the aperture of the light blocking part in the pixel unit is set on a color-by-color basis.

Figure 17A:
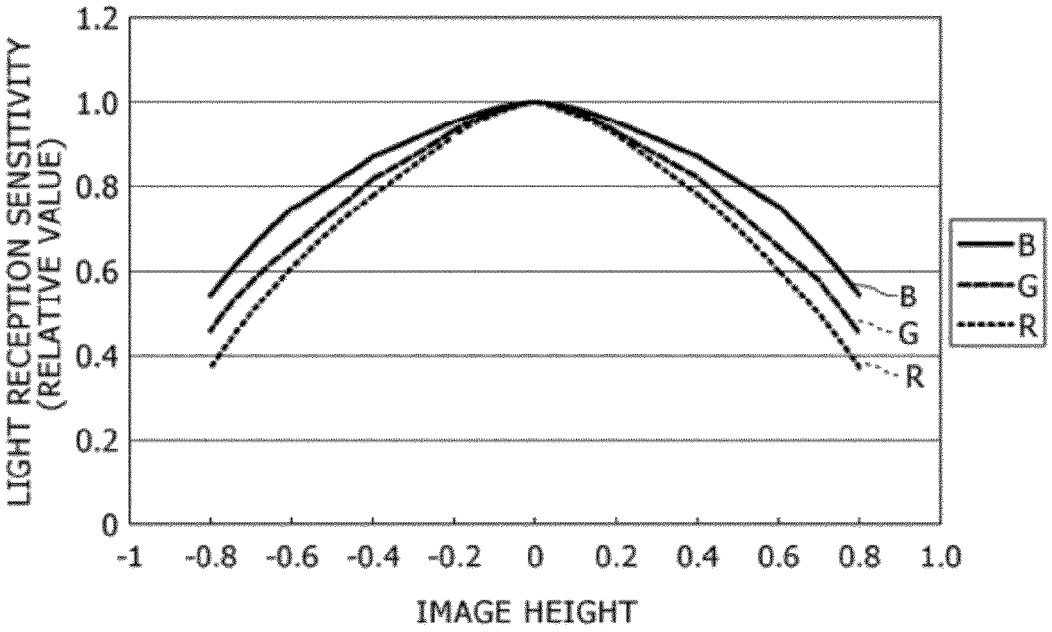
FIGS. 17A and 17B are diagrams showing the effect of the embodiment.
Figure 17B:
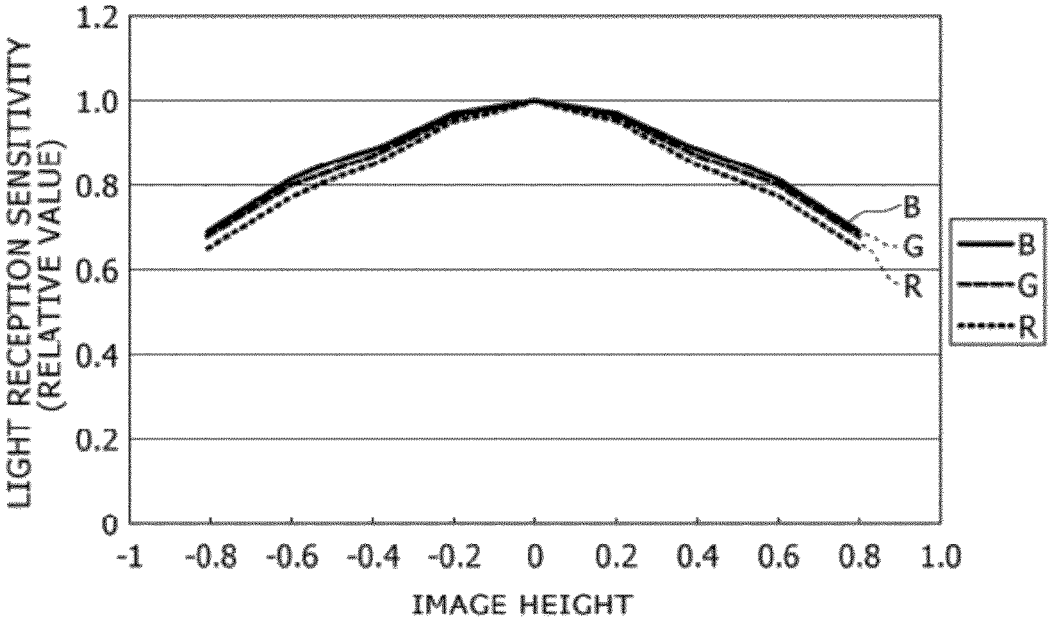

FIGS. 17A and 17B are diagrams showing the effect of the embodiments. FIG. 17A shows an example of the case in which the embodiment is not employed, and FIG. 17B shows an example of the case in which the embodiment (the setting of the position of the pixel and the setting of the position of the aperture of the light blocking part) is employed. In each diagram, the abscissa indicates the image height and the ordinate indicates the light reception sensitivity.

In the case in which the embodiment is not employed, shown in FIG. 17A, although the values of the light reception sensitivity are the same among the respective colors of RGB when the image height is 0%, increase in the image height yields large variation in the light reception sensitivity among the respective colors of RGB, which causes a high degree of color shading. On the other hand, in the case in which the embodiment is employed, shown in FIG. 17B, large variation in the light reception sensitivity among the respective colors of RGB is not caused even when the image height is increased from 0%, and thus the occurrence of color shading can be suppressed.

7. Electronic Apparatus

Figure 18:
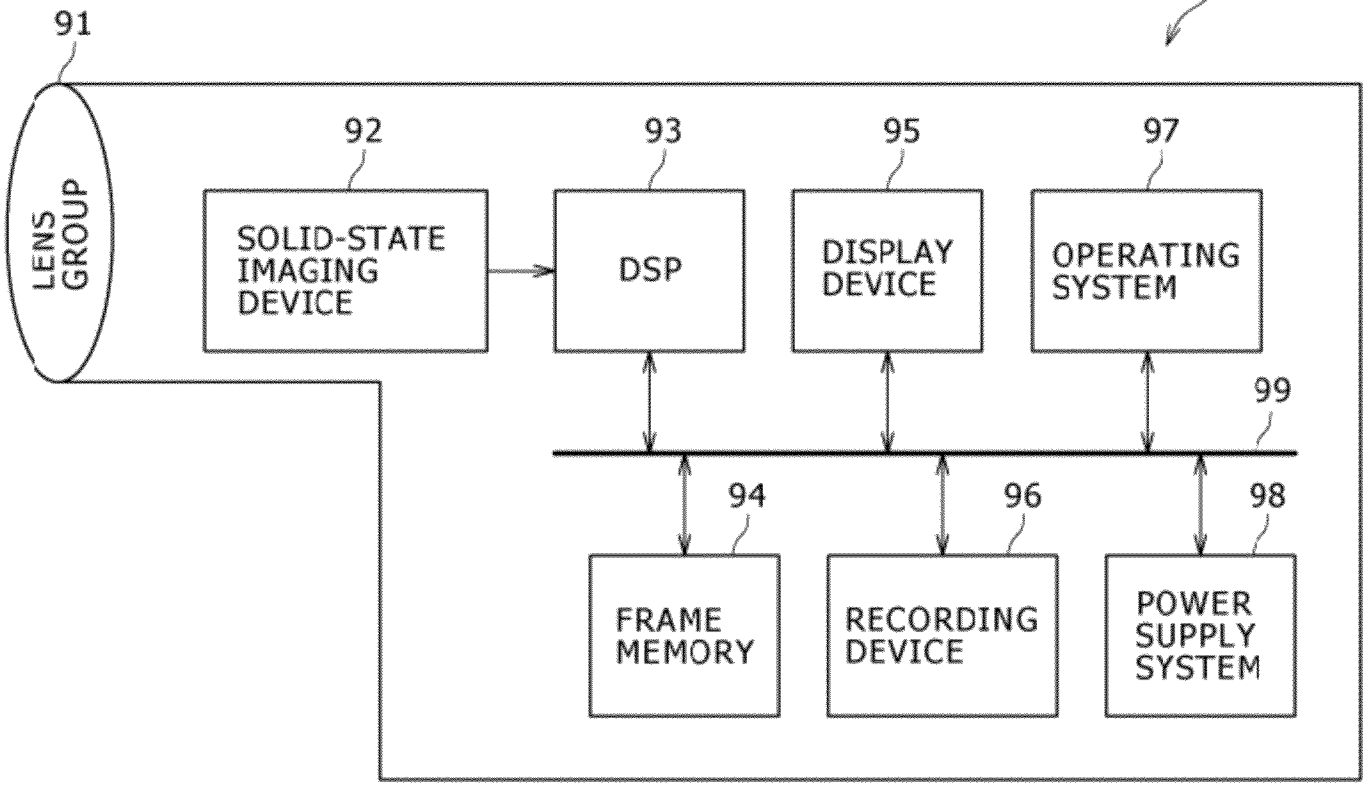
FIG. 18 is a block diagram showing a configuration example of imaging apparatus as one example of electronic apparatus based on the embodiment.

FIG. 18 is a block diagram showing a configuration example of imaging apparatus as one example of electronic apparatus based on the embodiment. As shown in FIG. 18, imaging apparatus 90 has an optical system including a lens group 91, a solid-state imaging device 92, a DSP circuit 93 as a camera signal processing circuit, a frame memory 94, a display device 95, a recording device 96, an operating system 97, a power supply system 98, and so on. Of these components, the DSP circuit 93, the frame memory 94, the display device 95, the recording device 96, the operating system 97, and the power supply system 98 are connected to each other via a bus line 99.

The lens group 91 captures incident light (image light) from a subject and forms the image on the imaging plane of the solid-state imaging device 92. The solid-state imaging device 92 converts the amount of light of the incident light from which the image is formed on the imaging plane by the lens group 91 into an electric signal on a pixel-by-pixel basis, and outputs the electric signal as a pixel signal. As this solid-state imaging device 92, the solid-state imaging device of any of the above-described embodiments is used.

The display device 95 is formed of a panel display device such as a liquid crystal display device or an organic electro luminescence (EL) display device, and displays a moving image or a still image obtained by the imaging by the solid-state imaging device 92. The recording device 96 records a moving image or a still image obtained by the imaging by the solid-state imaging device 92 in a recording medium such as a nonvolatile memory, a video tape, or a digital versatile disk (DVD).

The operating system 97 issues an operation command about various functions of the present imaging apparatus under operation by a user. The power supply system 98 appropriately supplies various kinds of power serving as the operating power for the DSP circuit 93, the frame memory 94, the display device 95, the recording device 96, and the operating system 97 to these supply targets.

Such imaging apparatus 90 is applied to a camera module for mobile apparatus such as a video camcorder, a digital still camera, and a cellular phone. By using the solid-state imaging device according to any of the above-described embodiments as this solid-state imaging device 92, imaging apparatus excellent in the color balance can be provided.

It should be understood by those skilled in the art that various modifications, combinations, sub-combinations and alterations may occur depending on design requirements and other factor in so far as they are within the scope of the appended claims or the equivalents thereof.

What is claimed is:

[1. A solid-state imaging device comprising:

a plurality of pixel units disposed in a matrix in an imaging area in such a way that a plurality of pixels corresponding to different colors are treated as one pixel unit; and a light blocking part provided corresponding to the plurality of pixel units and having apertures corresponding to the pixels in each of the pixel units, wherein, the sizes of the apertures of the light blocking part for each of the pixels in each of the pixel units are so set as to differ depending on distances from a center of the imaging area to a center of the respective pixel unit and depending on a color of the respective pixel.]

[2. The solid-state imaging device according to claim 1, wherein a circuit that processes a signal obtained by the pixels is formed of a complementary metal-oxide semiconductor transistor.]

3. The solid-state imaging device according to claim [1] *5*, wherein the pixels are so configured as to capture light from a surface on an opposite side to a surface over which an interconnect layer is formed[, of a substrate].

[4. The solid-state imaging device according to claim 1, wherein a transfer part that transfers a charge captured in the pixels by sequential applying of potential with different phases is provided between the plurality of pixel units.]

*5. A solid-state imaging device comprising:*

*a plurality of pixel units disposed in a matrix in an imaging area in such a way that a plurality of pixels corresponding to different colors are treated as one pixel unit; and*

*a light blocking part provided corresponding to the plurality of pixel units and having apertures corresponding to the pixels in each of the pixel units,*

*wherein sizes of the apertures of the light blocking part for each of the pixels in each of the pixel units are so set as to differ depending on distances from a center of the imaging area to a center of the respective pixel unit and depending on a color of the respective pixel,*

*wherein the imaging area includes a first region and a second region,*

*wherein the first region is closer to a center of the imaging area than the second region,*

*wherein the plurality of pixels includes a first pixel, a second pixel, a third pixel, and a fourth pixel,*

*wherein the apertures of the light blocking part include:*

*a first aperture disposed corresponding to the first pixel of a first color in the first region;*

*a second aperture disposed corresponding to the second pixel of a second color in the first region;*

*a third aperture disposed corresponding to the third pixel of the first color in the second region; and*

*a fourth aperture disposed corresponding to the forth pixel of the second color in the second region,*

*wherein a size of the first aperture is larger than a size of the third aperture, and*

*wherein a size of the second aperture is smaller than a size of the fourth aperture.*

*6. The solid-state imaging device of claim 5, wherein the first color is blue, and wherein the second color is red.*

*7. The solid-state imaging device of claim 6,*

*wherein the plurality of pixels includes a fifth pixel and a sixth pixel,*

*wherein the apertures of the light blocking part further include:*

*a fifth aperture disposed corresponding to the fifth pixel of a third color in the first region; and*

*a sixth aperture disposed corresponding to the sixth pixel of the third color in the second region,*

*wherein a size of the fifth aperture is a same size as the sixth aperture.*

*8. The solid-state imaging device of claim 7, wherein the third color is green.*

*9. The solid-state imaging device of claim 5, further comprising:*

*a substrate, wherein the pixels are included in the substrate; and*

*a plurality of color filters adjacent a first surface of the substrate.*

*10. The solid-state imaging device according to claim 9, further comprising:*

*an interconnect layer adjacent a second surface of the substrate.*

*11. The solid-state imaging device of claim 10, further comprising:*

*an antireflection film, wherein the antireflection film is between the substrate and the color filters.*

*12. The solid-state imaging device of claim 11, wherein the antireflection film is an HfO film.*

*13. The solid-state imaging device of claim 12, wherein the antireflection film has a thickness of at least 64 nm.*

*14. The solid-state imaging device of claim 11, further comprising:*

*an interlayer insulating film, wherein the interlayer insulating film is between the antireflection film and the color filters.*

*15. The solid-state imaging device of claim 14, further comprising: a plurality of microlenses, wherein the microlenses are provided on a side of the color filters opposite the substrate.*

*16. The solid-state imaging device of claim 5, wherein the light blocking part is composed of tungsten.*

*17. The solid-state imaging device of claim 5, further comprising:*

*a vertical drive circuit, wherein the vertical drive circuit has a readout scanning system operable to selective scan the pixels.*

*18. The solid-state imaging device of claim 17, further comprising:*

*a plurality of column circuits, wherein the column circuits receive signals output from respective pixels.*

*19. The solid-state imaging device of claim 18, wherein the column circuits execute correlated double sampling of the received signals.*

*20. The solid-state imaging device of claim 18, wherein the column circuits perform AD conversion.*

* * * * *